United States Patent
Tomoeda et al.

(10) Patent No.: US 11,849,627 B2
(45) Date of Patent: Dec. 19, 2023

(54) APPARATUS AND METHOD OF MANUFACTURING DISPLAY DEVICE

(71) Applicant: SAMSUNG DISPLAY CO., LTD., Yongin-si (KR)

(72) Inventors: Satoshi Tomoeda, Yongin-si (KR); Dongsul Kim, Yongin-si (KR); Jongkil Han, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 17/381,382

(22) Filed: Jul. 21, 2021

(65) Prior Publication Data

US 2022/0199902 A1 Jun. 23, 2022

(30) Foreign Application Priority Data

Dec. 17, 2020 (KR) .................. 10-2020-0177439

(51) Int. Cl.
*H01L 51/00* (2006.01)
*H10K 71/13* (2023.01)
*H10K 71/00* (2023.01)

(52) U.S. Cl.
CPC ........... *H10K 71/135* (2023.02); *H10K 71/00* (2023.02)

(58) Field of Classification Search
CPC ...................... H01L 51/0005; H01L 51/56
See application file for complete search history.

(56) References Cited

U.S. PATENT DOCUMENTS

| | | | |
|---|---|---|---|
| 6,585,339 B2 | 7/2003 | Schloeman et al. | |
| 7,306,309 B2 | 12/2007 | Kuwahara et al. | |
| 2012/0236328 A1 | 9/2012 | Ohnishi | |
| 2014/0063111 A1* | 3/2014 | Kakinuma | B41J 3/28 347/17 |
| 2016/0155030 A1* | 6/2016 | Blank | G06K 15/022 358/1.2 |
| 2020/0139737 A1* | 5/2020 | Kim | B41J 25/001 |

FOREIGN PATENT DOCUMENTS

| | | |
|---|---|---|
| JP | 2004114305 A | 4/2004 |
| KR | 20020057817 A | 7/2002 |
| KR | 101127179 B1 | 3/2012 |
| KR | 1020120082457 A | 7/2012 |

\* cited by examiner

*Primary Examiner* — Nathan T Leong
(74) *Attorney, Agent, or Firm* — CANTOR COLBURN LLP

(57) ABSTRACT

An apparatus includes a plurality of head portions which supplies droplets on a processing substrate, and a controller which applies a signal to each of the head portions, where the controller controls each of the head portions to supply the droplets on the processing substrate, where the signal includes a difference between a preset location of a pixel and an actual location of a pixel.

9 Claims, 15 Drawing Sheets

100 # APPARATUS AND METHOD OF MANUFACTURING DISPLAY DEVICE

This application claims priority to Korean Patent Application No. 10-2020-0177439, filed on Dec. 17, 2020, and all the benefits accruing therefrom under 35 U.S.C. § 119, the content of which in its entirety is herein incorporated by reference.

BACKGROUND

1. Field

One or more embodiments of the disclosure relate to an apparatus and a method of manufacturing using the apparatus, and more particularly, to an apparatus for manufacturing the display apparatus and a method of manufacturing the display apparatus using the apparatus.

2. Description of the Related Art

Recently, portable electronic devices have been widely used. As portable electronic devices, tablet PC, as well as small-sized electronic devices such as mobile phones, have been widely used recently.

Such a portable electronic device typically includes a display device capable of supporting various functions and providing a user with visual information such as images or videos. Recently, as the size of components for driving a display device has been reduced, the size of a display unit in an electronic device has gradually increased, and a structure capable of being bent by a predetermined angle from a flat state has been developed.

SUMMARY

In a display device having a structure capable of being bent by a predetermined angle from a flat state, it is desired to accurately manufacture pixel patterns to improve quality of products.

Droplets may be provided to an opening of a pixel defining layer to form an organic emission layer of pixel patterns. In this case, quality of a display device depends on how the droplets are accurately supplied to the opening of the pixel defining layer.

One or more embodiments provide an apparatus and method of manufacturing a display device, which are capable of applying a material of a set amount rapidly on an accurate position.

According to an embodiment, an apparatus for manufacturing a display device includes a plurality of head portions which supplies droplets on a processing substrate, and a controller which applies a signal to each of the head portions, where the controller controls each of the head portions to supply the droplet son the processing substrate, where the signal includes a difference between a preset location of a pixel and an actual location of a pixel.

In an embodiment, the controller may control a location of each of the head portions based on the signal.

In an embodiment, the apparatus may further include a mover, on which the head portions are disposed, where the mover adjusts locations of the head portions.

In an embodiment, the signal may include at least one selected from identification information of each head portion and a location where each of the head portion is to be positioned.

In an embodiment, the controller may control an interval between the head portions based on the signal.

In an embodiment, each of the head portions may include a plurality of nozzles, and at least one of the nozzles may start to discharge a droplet at a different time point from a time point when another of the nozzles starts to discharge a droplet.

In an embodiment, the apparatus may further include a substrate mounting portion disposed under at least one of the head portions, where the processing substrate is disposed on the substrate mounting portion.

In an embodiment, the substrate mounting portion may linearly move the processing substrate when the head portions supply the droplets onto the processing substrate.

In an embodiment, the head portions may respectively include a plurality of head controllers, and one of the head controllers may be connected to the controller in series, another of the head controllers may be connected to an adjacent head controller in series, and the signal sent from the controller may be sequentially transferred respectively to the head controllers.

In an embodiment, the apparatus may further include a droplet measuring portion which senses a location of a droplet falling from each of the head portions.

According to another embodiment, a method of manufacturing a display device includes calculating a difference between a set position, on which a head portion is set to be positioned in advance, and a control position on which the head portion is to be actually positioned, sensing a current location of the head portion, on which the head portion is currently positioned, and moving the head portion from the current location as much as a sum of the set position and a difference between the set position and the control position.

In an embodiment, the control position of the head portion may correspond to a plurality of pixel areas which is defined on a processing substrate to be spaced apart from one another.

In an embodiment, the method may further include arranging a processing substrate on a substrate mounting portion.

In an embodiment, the method may further include linearly moving the processing substrate to the substrate mounting portion.

In an embodiment, the method may further include discharging a droplet from at least one of a plurality of nozzles in the head portion at a different time point from a time point when another of the nozzles in the head portion discharges a droplet.

In an embodiment, the method may further include supplying a droplet from the head portion to the processing substrate.

In an embodiment, the method may further include sensing impact locations of droplets discharged from the nozzles of the head portion.

In an embodiment, the head portion may be provided in plural, and a plurality of head portions may be controlled independently of one another.

In an embodiment, the head portions may include a plurality of head controllers, respectively, and one of the head controllers may be connected to the controller in series, another of the head controllers may be connected to an adjacent head controller in series, and the signal sent from the controller may be sequentially transferred respectively to the head controllers.

According to another embodiment, a method of manufacturing a display device, the method includes arranging a head portion on a first location and discharging a droplet through the head portion to a part of a processing substrate on a substrate mounting portion, moving the head portion to a second location, and discharging a droplet through the head portion to another part of the processing substrate, wherein a distance between the second location and the first location is equal to a sum of a set distance which is set in advance and an error distance.

Such features of the disclosure may be performed using systems, methods, computer-readable storage mediums, and/or combinations thereof.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1:
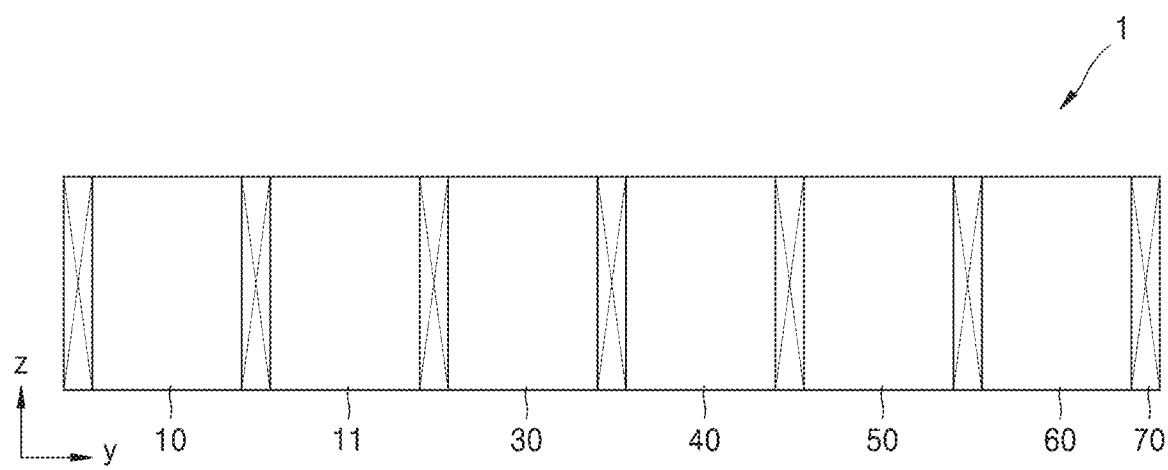
FIG. 1 is a front view of an apparatus for manufacturing a display device, according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

The embodiments will be described below in more detail with reference to the accompanying drawings. Those components that are the same or are in correspondence are rendered the same reference numeral regardless of the figure number, and redundant description thereof may be omitted.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Sizes of components in the drawings may be exaggerated for convenience of explanation. In other words, since sizes and thicknesses of components in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a front view of an apparatus 1 for manufacturing a display device, according to an embodiment.

Referring to FIG. 1, an embodiment of the apparatus 1 for manufacturing a display device may include a loading portion 10, a first processing portion 11, a second processing portion 30, a third processing portion 40, a fourth processing portion 50, an unloading portion 60, and an opening/closing portion 70.

The loading portion 10 may temporarily accommodate a processing substrate MS (shown in FIG. 2) provided from outside or from another manufacturing apparatus, and may supply the processing substrate MS to the first processing portion 11. In an embodiment, the loading portion 10 may include a shuttle (not shown) including an electrostatic chuck, etc. arranged therein. In an embodiment, although not shown in FIG. 1, a robot arm, etc. may be provided outside the loading portion 10 to supply the processing substrate MS to the shuttle.

The first processing portion 11 may generate or form a first auxiliary layer (not shown) on a certain region of the processing substrate MS. In such an embodiment, the first processing portion 11 may generate the first auxiliary layer in various ways. In one embodiment, for example, the first processing portion 11 may supply a deposition material to the processing substrate MS in the form of gas through evaporation or sublimation, etc. to generate the first auxiliary layer. In such an embodiment, the first processing portion 11 may include a mask assembly including an additional chamber, a deposition source provided in the chamber and for accommodating the deposition material, and an opening for partially transmitting the deposition material. In an alternative embodiment, the first processing portion 11 may provide the processing material MS with a material in an inkjet manner to form the first auxiliary layer. In such an embodiment, the first processing portion 11 includes a head portion for discharging droplets to supply the droplets to the processing substrate MS.

In an embodiment, the second processing portion 30 is connected to the first processing portion 11 and may generate or form an organic emission layer on the first auxiliary layer in an inkjet manner. In an alternative embodiment, the second processing portion 30 may supply the deposition material to the processing substrate MS in the form of gas, similarly to the first processing portion 11. The third processing portion 40 may be connected to the second processing portion 30 to generate a second auxiliary layer on the organic emission layer. In such an embodiment, the third processing portion 40 is the same as or similar to the first processing portion 11 described above, and thus, any repetitive detailed descriptions thereof will be omitted.

In an embodiment, as described above, at least one of the first processing portion 11 to the third processing portion 40 may supply the material to the processing substrate MS in the inkjet manner. Hereinafter, for convenience of description, an embodiment in which the second processing portion 30 supplies the material to the processing substrate MS in the inkjet manner will be described in detail.

In an alternative embodiment, the first processing portion 11 to the third processing portion 40 may not be distinguished from one another, but may be integrally provided with one another. In such an embodiment, the first processing portion 11, the second processing portion 30, and the third processing portion 40 may be provided in one chamber having one internal space. Hereinafter, for convenience of description, an embodiment in which the first processing portion 11 to the third processing portion 40 are distinguished or separated from one another will be described in detail.

In an embodiment, the fourth processing portion 50 may generate or form an opposite electrode on a second protective layer.

The unloading portion 60 may be connected to the fourth processing portion 50 and may carry out the processing substrate MS finishing the processes in the fourth processing portion 50 to outside or may supply the processing substrate MS to a different manufacturing apparatus.

The opening/closing portions 70 may be at adjacent portions among the loading portion 10, the first processing portion 11, the second processing portion 30, the third processing portion 40, the fourth processing portion 50, and the unloading portion 60. In an embodiment, the opening/closing portion 70 may be provided in the form of a gate valve that operates to open or close each space such that the processing substrate MS may be moved.

In such an embodiment, the apparatus 1 for manufacturing the display device may further include various processing portions in addition to the above components. In one embodiment, for example, the apparatus 1 for manufacturing the display device may further include a processing portion for forming a hole in the processing substrate MS or removing a partial layer in the processing substrate MS. In an alternative embodiment, the apparatus 1 for manufacturing the display device may further include a processing portion for forming a protective layer on the opposite electrode or forming a thin film encapsulation layer. In another alternative embodiment, the apparatus 1 for manufacturing the display device may further include a processing portion for arranging a sealing unit and an encapsulation substrate and fixing the encapsulation substrate on the processing substrate.

Figure 2:
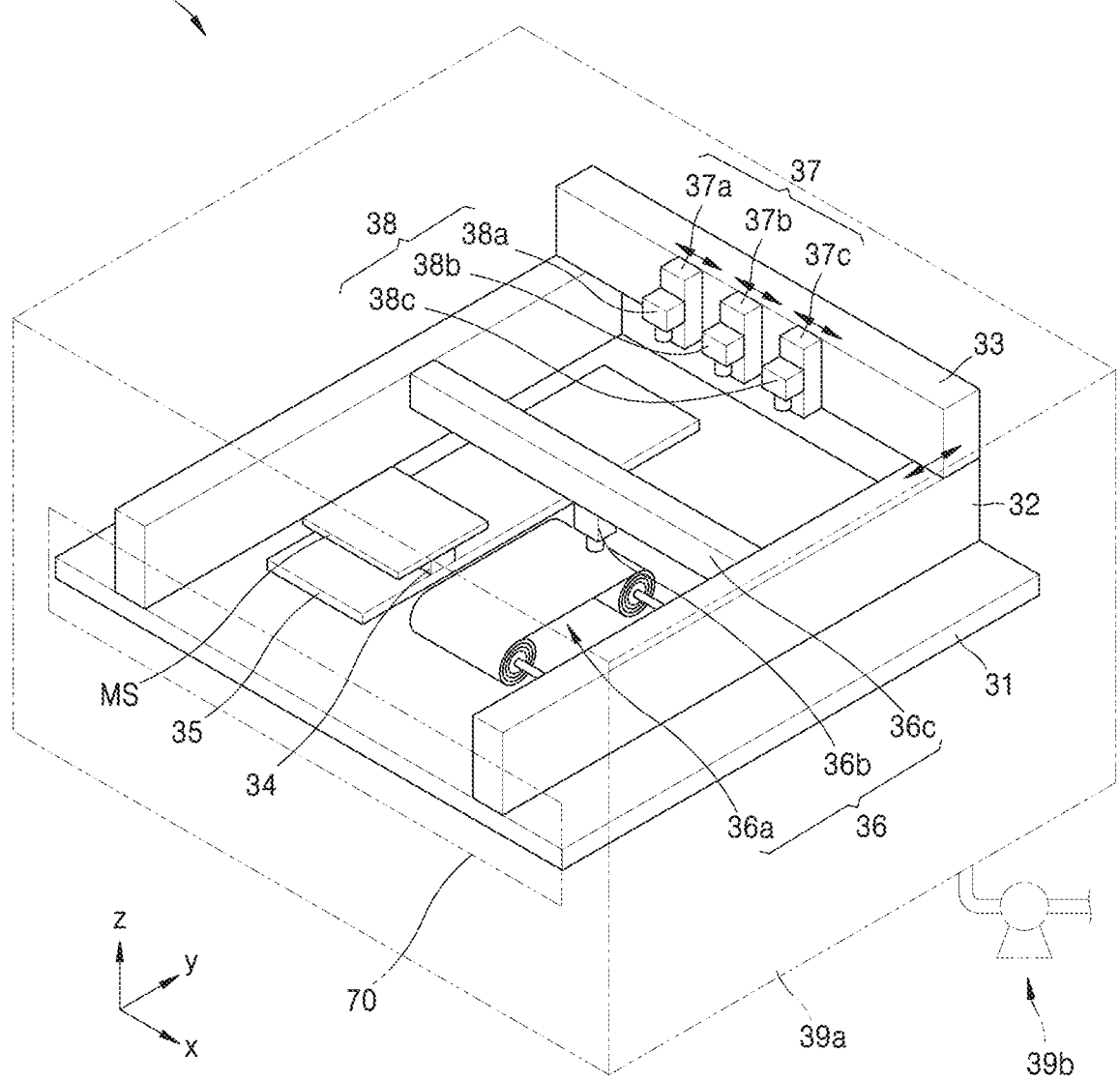
FIG. 2 is a perspective view of an embodiment of a second processing portion of FIG. 1.
Figure 3:
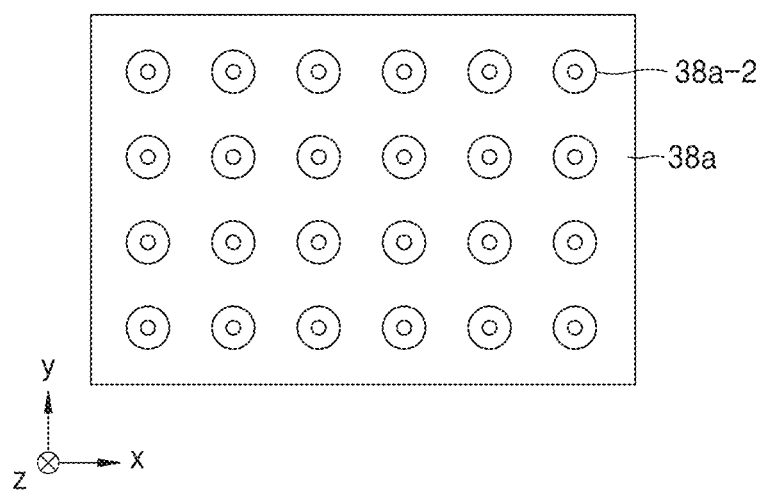
FIG. 3 is a rear view of a lower surface of a head portion shown in FIG. 2.
Figure 4:
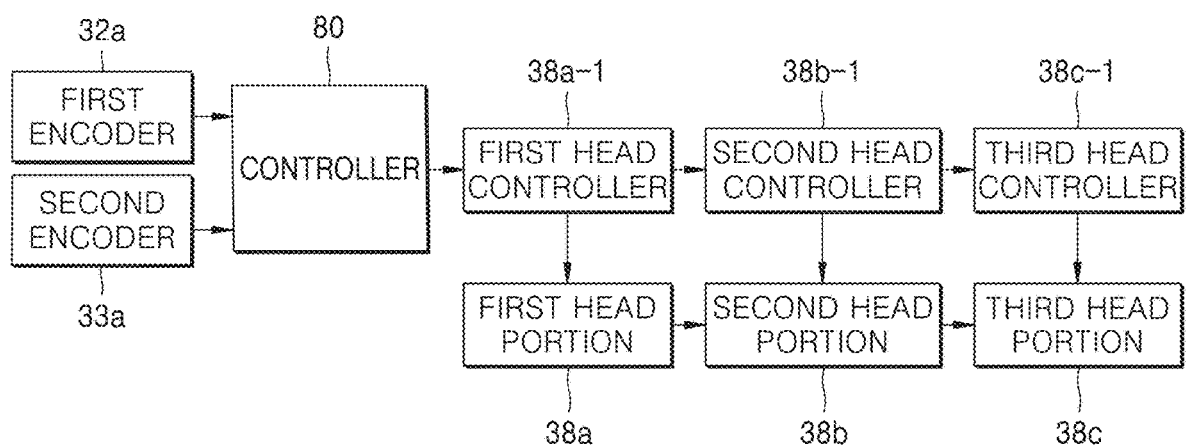
FIG. 4 is a block diagram illustrating a control flow of the second processing portion shown in FIG. 2.
Figure 5:
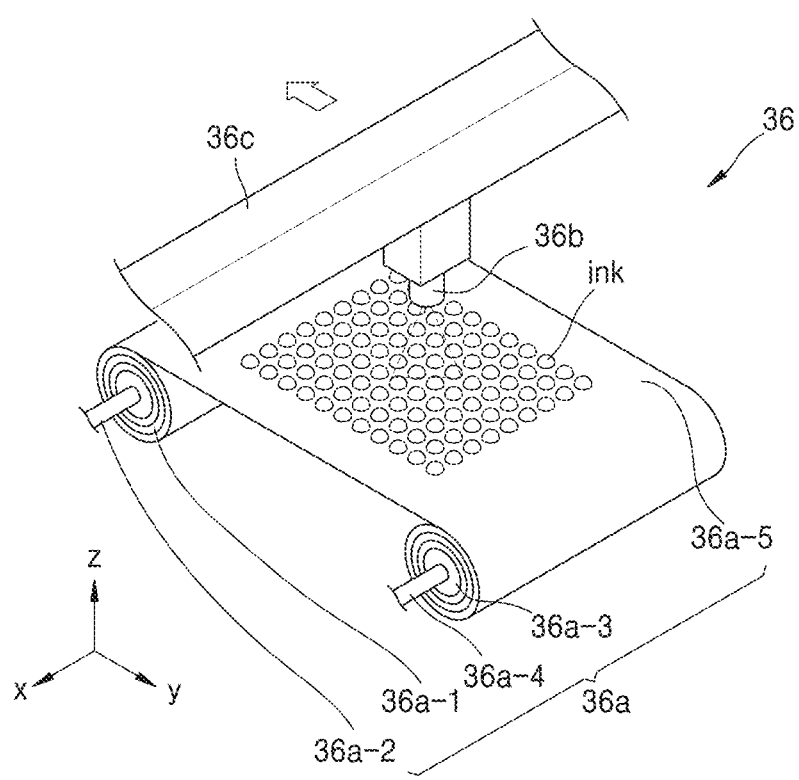
FIG. 5 is a perspective view showing an inspection unit shown in FIG. 2.

FIG. 2 is a perspective view of an embodiment of the second processing portion 30 of FIG. 1. FIG. 3 is a rear view of a lower surface of a head portion shown in FIG. 2. FIG. 4 is a block diagram illustrating a control flow of the second processing portion 30 shown in FIG. 2. FIG. 5 is a perspective view showing an inspection unit shown in FIG. 2.

Referring to FIGS. 2 to 5, an embodiment of the second processing portion 30 may include a stage 31, a first gantry 33, a mover 37, a droplet discharge portion 38, a droplet measuring portion 36, a controller 80, a chamber 39a, and a pressure adjuster 39b.

The stage 31 may include guide members 32 and a substrate moving member 35. The stage 31 may have an align mark (not shown) for aligning the processing substrate MS.

In an embodiment, the processing substrate MS may be a display device or a display panel that is being manufactured. The processing substrate MS may include a substrate or a substrate on which at least one of various layers is formed or disposed. In an embodiment, the substrate may include glass or a polymer resin such as polyethersulfone, polyarylate, polyetherimide, polyethylene naphthalate, polyethylene terephthalate, polyphenylene sulfide, polyimide, polycarbonate ("PC"), cellulose tri-acetate ("TAC"), cellulose acetate propionate, etc.

The guide members 32 may be spaced apart from each other with the substrate moving member 35 therebetween. A length of the guide member 32 may be greater than a length of an edge of the processing substrate MS. Here, the length of the guide member 32 and the length of the edge of the processing substrate MS may be measured in a y-direction of FIG. 1.

The first gantry 33 may be on the guide members 32. In an embodiment, the guide members 32 may be configured in a way, e.g., having certain rails, such that the first gantry 33 may linearly move along the lengthwise directions of the guide members 32. In one embodiment, for example, the guide member 32 may include a linear motion rail.

A substrate mounting portion (not shown) may include the substrate moving member 35 and a substrate rotating member 34. The substrate moving member 35 may be on the stage 31 and may include the substrate rotating member 34. The substrate moving member 35 may extend in the lengthwise direction of the guide member 32. In one embodiment, for example, referring to FIG. 2, the substrate moving member 35 may extend in the y-direction. In an embodiment, the substrate moving member 35 may include a rail such that the substrate rotating member 34 may linearly move. In one embodiment, for example, the substrate moving member 35 may include a linear motion rail.

The substrate rotating member 34 may rotate on the substrate moving member 35. When the substrate rotating member 34 rotates, the processing substrate MS on the substrate rotating member 34 may rotate. In an embodiment, the substrate rotating member 34 may rotate about a rotary shaft that is perpendicular to a surface of the stage 31, on which the processing substrate MS is mounted. When the substrate rotating member 34 rotates about the rotary shaft that is perpendicular to the surface of the stage 31 on which the processing substrate MS is mounted, the processing substrate MS on the substrate rotating member 34 may be also rotated about the rotary shaft that is perpendicular to the surface of the stage 31 on which the processing substrate MS is mounted.

The first gantry 33 may be on the guide members 32. In an embodiment, the first gantry 33 may be on the guide members 32 that are spaced apart from each other at opposite sides of the substrate moving member 35.

The first gantry 33 may move in the lengthwise direction of the guide member 32 (e.g., y-direction of FIG. 2). In an embodiment, the first gantry 33 may be passively moved linearly, or may automatically move linearly by including a motor cylinder, etc. In one embodiment, for example, the first gantry 33 may include a linear motion block that moves along the linear motion rail to perform linear movement automatically.

The mover 37 and the droplet discharge portion 38 for discharging the droplets may be on the first gantry 33. In an embodiment, the mover 37 may linearly move on the first gantry 33 in a lengthwise direction of the first gantry 33 (e.g., x-direction of FIG. 2). In one embodiment, for example, the first gantry 33 may include a rail such that the mover 37 may linearly move.

A moving unit of the mover 37 and a head portion of the droplet discharge portion 38 may be provided in various ways. In one embodiment, for example, one moving unit and one head portion may be provided. In such an embodiment, there may be at least one nozzle head for discharging droplet from the head portion.

In an alternative embodiment, at least one head portion and one moving unit may be provided. In an embodiment, where a plurality of head portions is provided, the plurality of head portions may be provided on one moving unit such that the plurality of head portions simultaneously move based on the movement of the moving unit.

In another alternative embodiment, a plurality of moving units and a plurality of head portions may be provided. In such an embodiment, at least one head portion may be provided on one moving unit. Hereinafter, for convenience of description, embodiments in which one head portion is provided on one moving unit will be described in detail.

In an embodiment, the mover 37 may include a plurality of moving units. In an embodiment, the mover 37 may include a first moving unit 37a, a second moving unit 37b, and a third moving unit 37c. In an alternative embodiment, the mover 37 may include at least one moving unit or four or more moving units. For convenience of description, embodiments in which the mover 37 includes the first moving unit 37a, the second moving unit 37b, and the third moving unit 37c will hereinafter be described in detail.

In an embodiment, a distance between the first moving unit 37a and the second moving unit 37b may be equal to that between the second moving unit 37b and the third moving unit 37c. In an alternative embodiment, the distance between the first moving unit 37a and the second moving unit 37b may be different from that between the second moving unit 37b and the third moving unit 37c.

The mover 37 may be linearly moved on the first gantry 33. In an embodiment, the mover 37 may move along the lengthwise direction of the first gantry 33. In one embodiment, for example, at least one of the first moving unit 37a, the second moving unit 37b, and the third moving unit 37c may move in the x-direction or −x direction.

In an embodiment, the mover 37 may perform the linear movement manually. In an alternative embodiment, the mover 37 may include a motor, a cylinder, etc. to perform the linear movement automatically. In one embodiment, for example, the mover 37 may include the linear motion block that moves along the linear motion rail.

The head portion of the droplet discharge portion 38 may be provided on the moving unit of the mover 37. In one embodiment, for example, a first head portion 38a may be on the first moving unit 37a. In such an embodiment, a second head portion 38b may be on the second moving unit 37b. In such an embodiment, a third head portion 38c may be on the third moving unit 37c.

The droplet discharge portion 38 may discharge the droplet on the processing substrate MS or a test table 36a that will be described later. In an embodiment, the droplet may include liquid crystal droplet, an orientation liquid droplet, or a red, green, and blue inks in which pigment particles are mixed in a solvent. In an alternative embodiment, the droplet may include a polymer or low-molecular weight organic material corresponding to at least one layer in intermediate layers of an organic light-emitting display apparatus.

The first head portion 38a, the second head portion 38b, and the third head portion 38c may adjust the droplet amount independently of each other. In an embodiment, the first head portion 38a, the second head portion 38b, and the third head portion 38c may be electrically connected to the controller 80. Therefore, the droplet amount discharged from the first head portion 38a, the second head portion 38b, and the third head portion 38c may be respectively adjusted by the controller 80.

At least one of the first to third head portions 38a to 38c may include at least one nozzle for discharging one droplet. In an embodiment, a plurality of nozzles may be provided, and the plurality of nozzles may be arranged in one column or arranged in a matrix form having columns and rows. Hereinafter, for convenience of description, embodiments in which each of the first head portion 38a to the third head portion 38c includes a plurality of nozzles arranged in a matrix form having columns and rows will be described in detail.

In one embodiment, for example, the first head portion 38a may include a plurality of first nozzles 38a-2 in a lower surface thereof. In such an embodiment, the plurality of first nozzles 38a-2 may be arranged in columns and rows.

In such an embodiment, each head portion may include a head controller. In one embodiment, for example, the first head portion 38a may include a first head controller 38a-1, the second head portion 38b may include a second head controller 38b-1, and the third head portion 38c may include a third head controller 38c-1. The first head controller 38a-1, the second head controller 38b-1, and the third head controller 38c-1 is each connected to the controller 80 to control the first head portion 38a, the second head portion 38b, and the third head portion 38c based on a signal transmitted from the controller 80. In such an embodiment, because each head controller controls the head portion in a similar way, and thus, hereinafter, a method for the first head controller 38a-1 to control the first head portion 38a will be described below in detail a.

In an embodiment, when a signal is applied from the controller 80 to the first head controller 38a-1, the first head controller 38a-1 may obtain information about an amount of the droplet to be discharged from the first head portion 38a, the number of times of discharging the droplets, and a time point of starting the discharge and then may control the first head portion 38a based on the obtained information. In such an embodiment, the first head controller 38a-1 may control each of the first nozzles 38a-2 of the first head portion 38a. In one embodiment, for example, the first head controller 38a-1 identifies the information corresponding to the first head portion 38a from the signal applied from the controller 80, and when it is determined that the information corresponds to the first head portion 38a, the first head controller 38a-1 may identify one of the plurality of first nozzles 38a-2 in the first head portion 38a, which corresponds to the information, and may control the corresponding first nozzle 38a-2 based thereon. In such an embodiment, the first head controller 38a-1 may perform the above operations simultaneously.

In such an embodiment, the controller 80 may be sequentially connected to the first head controller 38a-1, the second head controller 38b-1, and the third head controller 38c-1. The controller 80 may be connected to the first head controller 38a-1, the second head controller 38b-1, and the third head controller 38c-1 in series. In such an embodiment, the signal sent from the controller 80 is transferred to the first head controller 38a-1, then is transferred from the first head controller 38a-1 to the second head controller 38b-1, and then, may be transferred from the second head controller 38b-1 to the third head controller 38c-1. In such an embodiment, the controller 80 may not individually connect and communicate with each head controller, and the signal applied from the controller 80 may include information corresponding to all the head portions. In such an embodiment, each head controller may determine whether the signal transferred from the controller 80 or the signal transferred from adjacent head controller includes the information to be processed by the head portion thereof.

In an embodiment, the signal sent from the controller 80 includes information about all the head portions, and thus, the signal may include an identification number of each head portion, e.g., identification information of the corresponding head portion, and an identification number about the corresponding nozzle in each head portion. In such an embodiment, the signal sent from the controller 80 may include an identification number indicating whether the information is the information about the first head portion 38a, the information about the second head portion 38b, or the information about the third head portion 38c. In an embodiment, when the signal sent from the controller 80 includes the information about the first head portion 38a, the signal may also include an identification number of each of the first nozzles 38a-2 in the first head portion 38a. In such an embodiment, the identification number about the first nozzle may include information about a row and a column at which each of the first nozzles 38a-2 is located. Therefore, based on the signal applied from the controller 80, the first head controller 38a-1 may determine the position of the first head portion 38a, an amount of droplet discharged from each of the first nozzles 38a-2, the number of times of discharging the droplet, and the time point of starting the discharge of the droplet. In an embodiment, the first head controller 38a-1 may ignore the information that is not about the identification number of the first head portion 38a, and thus, the data processing may be performed with high speed. In an embodiment, the first head controller 38a-1 may transmit the signal sent from the controller 80 to the second head controller 38b-1 without delay, and the second head controller 38b-1 may process the information without temporal delay. In such an embodiment, the third head controller 38c-1 may receive the signal sent from the controller 80 from the second head controller 38b-1, and thus, may process the information simultaneously or nearly simultaneously with the first head controller 38a-1 and the second head controller 38b-1.

The controller 80 may determine a kind of the material discharged from each of the nozzles in each head portion. In one embodiment, for example, the controller 80 may allow some of the plurality of first nozzles 38a-2 in the first head portion 38a to discharge a red light-emitting material, some other of the plurality of first nozzles 38a-2 to discharge a blue organic light-emitting material, and remaining of the plurality of first nozzles 38a-2 to discharge a green organic light-emitting material. In an alternative embodiment, the controller 80 may control the head portions to discharge different materials from one another. However, operations of the controller 80 is not limited to those described above, and may individually control each of the head portions in a way such that each of the nozzles may discharge different droplets based on the kind of the material to be discharged, and the kind of arrangements of target positions of the discharged material.

The droplet measuring portion 36 may measure the droplet discharged from the droplet discharge portion 38. In an embodiment, the droplet discharged from the droplet discharge portion 38 may be measured. The droplet measuring portion 36 may measure a volume of the droplet discharged from the droplet discharge portion 38, before the droplet discharge portion 38 discharges the droplet on the processing substrate MS. In such an embodiment, the controller 80 may measure the volume of the droplet discharged from the droplet discharge portion 38 based on the measurement result of the droplet measuring portion 36. In an embodiment, the droplet measuring portion 36 may measure a point where the droplet discharged from the droplet discharge portion 38 has fallen. In such an embodiment, the controller 80 may measure the point of the processing substrate MS, on which the droplet falls from a corresponding nozzle, by calculating a distance from a reference point to a point where the droplet has fallen measured by the droplet measuring portion 36.

The droplet measuring portion 36 may include a test table 36a, a droplet sensor 36b, and a second gantry 36c.

The test table 36a may be on the stage 31. In an embodiment, the test table 36a may be between the guide members 32. In such an embodiment, the second processing portion 30 may include at least one test table 36a. In one embodiment, for example, the second processing portion 30 may include a plurality of test tables 36a. Therefore, amounts and positions of the droplets discharged from the plurality of head portions and amounts and positions of the droplets discharged from the plurality of nozzles in each head portion may be simultaneously tested, and thus, efficiency of inspecting the droplets may be improved.

In an embodiment, as shown in FIG. 5, the test table 36a may include a film supply unit 36a-1 and a film collection unit 36a-3. The film supply unit 36a-1 and the film collection unit 36a-3 may be spaced apart from each other. In an embodiment, the film supply unit 36a-1 and the film collection unit 36a-3 may be spaced apart from each other in the lengthwise direction of the guide member 32. In one embodiment, for example, the film supply unit 36a-1 and the film collection unit 36a-3 may be spaced apart from each other in the y-direction. In such an embodiment, the film supply unit 36a-1 and the film collection unit 36a-3 may be connected and fixed on the ground, an inner wall of a building, etc.

The film supply unit 36a-1 may supply a film 36a-5. The film 36a-5 may be provided as a roll in the film supply unit 36a-1. In such an embodiment, the film 36a-5 may be wound on the film supply unit 36a-1. The film supply unit 36a-1 may include a first axis 36a-2 which may rotate to supply the film 36a-5. The first axis 36a-2 may be connected to the driver. Therefore, the first axis 36a-2 may be rotated by the driver.

The film collection unit 36a-3 may collect the film 36a-5. In an embodiment, the film collection unit 36a-3 may collect the film 36a-5 supplied by the film supply unit 36a-1. The film 36a-5 may be collected as a roll in the film collection unit 36a-3. In such an embodiment, the film 36a-5 finishing the measurement of the discharged droplets may be wound in the film collection unit 36a-3. The film collection unit 36a-3 may include a second axis 36a-4 which may rotate to collect the film 36a-5. The second axis 36a-4 may be connected to the driver. Therefore, the second axis 36a-4 may be rotated by the driver.

The film 36a-5 may be supplied by the film supply unit 36a-1 and collected by the film collection unit 36a-3. Therefore, when the inspection of the droplet discharged on a first portion of the film 36a-5 is finished, the film 36a-5 may be replaced such that a second portion of the film 36a-5 faces the droplet discharge portion 38. In an embodiment, the film 36a-5 may include a material that is the same as or similar to that of the processing substrate MS. In an embodiment, the film 36a-5 may include a glass film or a polymer resin such as polyethersulfone, polyarylate, polyetherimide, polyethylene naphthalate, polyethylene terephthalate, polyphenylene sulfide, polyimide, PC, TAC, cellulose acetate propionate, etc.

In an embodiment, as described above, the test table 36a includes the film supply unit 36a-1 and the film collection unit 36a-3, but not being limited thereto. In an alternative embodiment, the test table 36a may include a test substrate and a test substrate stage on which the test substrate is provided. In such an embodiment, the test substrate may be replaced by a robot arm. The test substrate may include a material that is the same as or similar to that of the processing substrate MS or the film 36a-5.

The droplet sensor 36b may sense a position of the droplet, a volume of the droplet, etc. In an embodiment, the droplet sensor 36b may include a confocal microscope or an interferometric microscope. The confocal microscope may obtain a plurality of two-dimensional images of an object at different depths, and reconstruct a three-dimensional structure of the object based on the two-dimensional images. The confocal microscope may include, for example, chromatic confocal microscope, chromatic line confocal microscope, etc. An interferometric microscope is a microscope that observers and quantitatively measures changes in fine structure irregularities and phases of an object. The interferometric microscope may include, for example, a laser interferometric microscope, a white light interferometric microscope, etc.

The droplet measuring portion 36 may include at least one droplet sensor 36b. In one embodiment, for example, the droplet measuring portion 36 may include a plurality of droplet sensors 36b. In such an embodiment, amounts of droplets discharged from the plurality of head portions may be simultaneously inspected, and efficiency of the droplet inspection may be improved.

The droplet sensor 36b may linearly move along the second gantry 36c that will be described later, and may be linearly moved with the second gantry 36c. In an embodiment, the droplet sensor 36b may move in the lengthwise direction of the second gantry 36c. In one embodiment, for example, the droplet sensor 36b may move in the x-direction or −x direction. In an embodiment, the droplet sensor 36b may linearly move together with the second gantry 36c, as the second gantry 36c moves. In one embodiment, for example, the droplet sensor 36b may move in the y-direction or −y direction with the second gantry 36c.

The second gantry 36c may be provided on the guide members 32. In an embodiment, the second gantry 36c may be provided on the guide members 32 that are spaced apart from each other with the test table 36a therebetween, similarly to the first gantry 33.

The second gantry 36c may move in the lengthwise direction of the guide member 32. In an embodiment, the second gantry 36c may be passively moved linearly, or may automatically move linearly by including a motor cylinder, etc. In one embodiment, for example, the second gantry 36c may include a linear motion block that moves along the linear motion rail to perform linear movement automatically.

Referring back to FIG. 2, the droplet sensor 36b is connected to the second gantry 36c, but not being limited thereto. In an alternative embodiment, the first gantry 33 and the second gantry 36c may be integrally provided or formed with each other as a single unitary unit. In such an embodiment, the droplet sensor 36b may be spaced apart from the mover 37, or the droplet sensor 36b may be on the mover 37 similarly to the droplet discharge portion 38. However, for convenience of description, embodiments in which the second processing portion 30 includes the second gantry 36c and the droplet sensor 36b is connected to the second gantry 36c will hereinafter be described in detail.

In an embodiment, the controller 80 may measure the volume of the droplet discharged on the test table 36a, based on a shape of the droplet, a surface of the droplet, etc. measured by the droplet sensor 36b. In such an embodiment, the controller 80 may calculate a falling point of the droplet discharged from each head portion and each nozzle, by comparing the position of the droplet sensed by the droplet sensor 36b with the reference position. In such an embodiment, the controller 80 may determine and store the head portion and the nozzle corresponding to the falling point of the droplet.

The first gantry 33 or one of the guide members 32 includes a first encoder 32a, and one of the movers 37 and the first gantry 33 may include a second encoder 33a. In an embodiment, the first encoder 32a may sense or measure the position of the first gantry 33. The second encoder 33a may sense or measure the position of the mover 37. Hereinafter, for convenience of description, embodiments in which the first encoder 32a is on the guide member 32 and the second encoder 33a is on the first gantry 33 will be described in detail.

In an embodiment, as described above, the first encoder 32a and the second encoder 33a may transmit sensed result or generated result to the controller 80. The controller 80 may calculate a current location of each head portion based on the results transmitted from the first encoder 32a and the second encoder 33a.

A droplet (ink) may be discharged on the test table 36a. In an embodiment, a droplet head portion (not shown) may face the test table 36a, and the droplet may be discharged on the test table 36a from the droplet head portion.

Next, a surface profile of the discharged droplet (ink) may be measured. In an embodiment, the droplet sensor 36b may measure the surface profile of the discharged droplet (ink). In such an embodiment, the second gantry 36c may move in the y-direction or −y direction, and the second gantry 36c may move the droplet sensor 36b in the y-direction or −y direction. The droplet sensor 36b may face the droplet (ink) to measure the surface profile of the droplet (ink).

Next, the controller 80 may measure a volume of the discharged droplet (ink) by reflecting or based on the surface profile of the test table 36a to the surface profile of the discharged droplet (ink). In an embodiment, the controller 80 may measure information about a space occupied by the discharged droplet (ink) from a difference between the surface profile of the discharge droplet (ink) and the surface profile of the test table 36a. Therefore, an accurate volume of the discharged droplet (ink) may be measured.

In an embodiment, the controller 80 may compare the accurate volume of the discharged droplet (ink) obtained from the droplet measurement unit with a preset volume of the droplet to be discharged from the droplet head portion.

In one embodiment, for example, the controller 80 may set in a way such that the droplet of 1 milliliter (ml) is discharged from the first head portion. In addition, the first head portion discharge a preset amount of droplet (e.g., 1 ml) from the droplet measurement unit. Here, when the accurate volume of the discharged droplet obtained from the droplet measurement unit is not 1 ml, the controller 80 may change the preset volume of the droplet to be discharged from the first head portion. By repeating the above processes, the amount of droplet set originally set to be discharged may be discharged from the droplet head portion. Therefore, the volume of the droplet discharged from the droplet head portion may be precisely controlled.

The chamber 39a may include a space therein and may have an opening part. Here, the opening/closing portion 70 may be provided at the opening part of the chamber 39a. A pressure adjuster 39b may be connected to the chamber 39a to adjust internal pressure of the chamber 39a. In an embodiment, when the droplet is supplied to the processing substrate MS, the pressure adjuster 39b may set the internal pressure of the chamber 39a to be nearly similar to a vacuum state. In such an embodiment, when the processing substrate MS enters the chamber 39a, the pressure adjuster 39b may set the internal pressure of the chamber 39a to be the same as or similar to an internal pressure of another adjacent chamber or to be similar to an atmospheric pressure.

Figure 6:
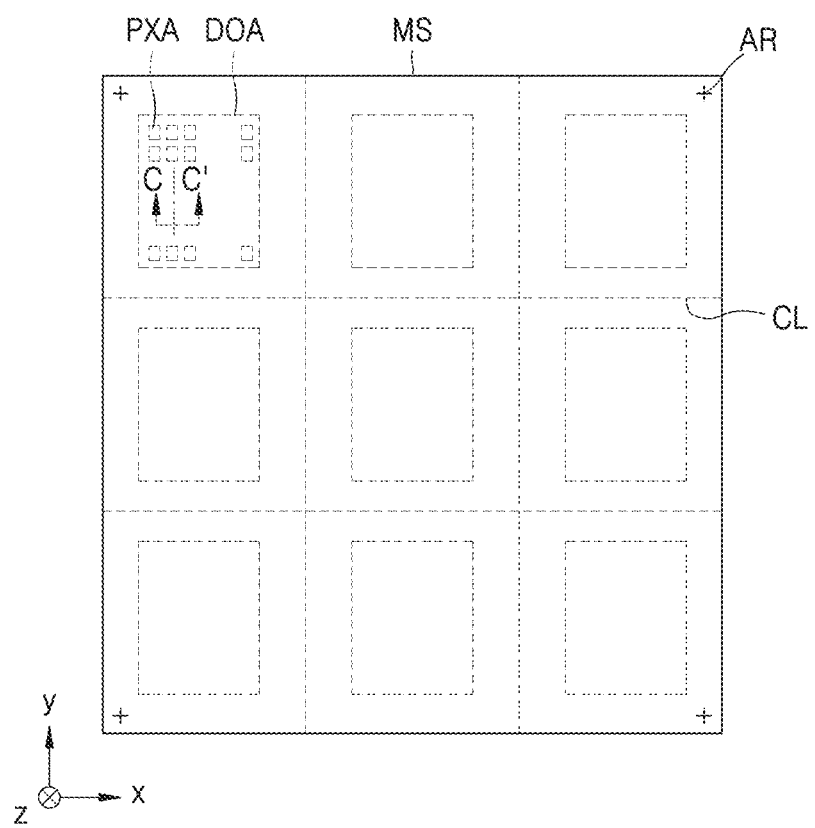
FIG. 6 is a plan view of a processing substrate used in the second processing portion of FIG. 2.
Figure 7:
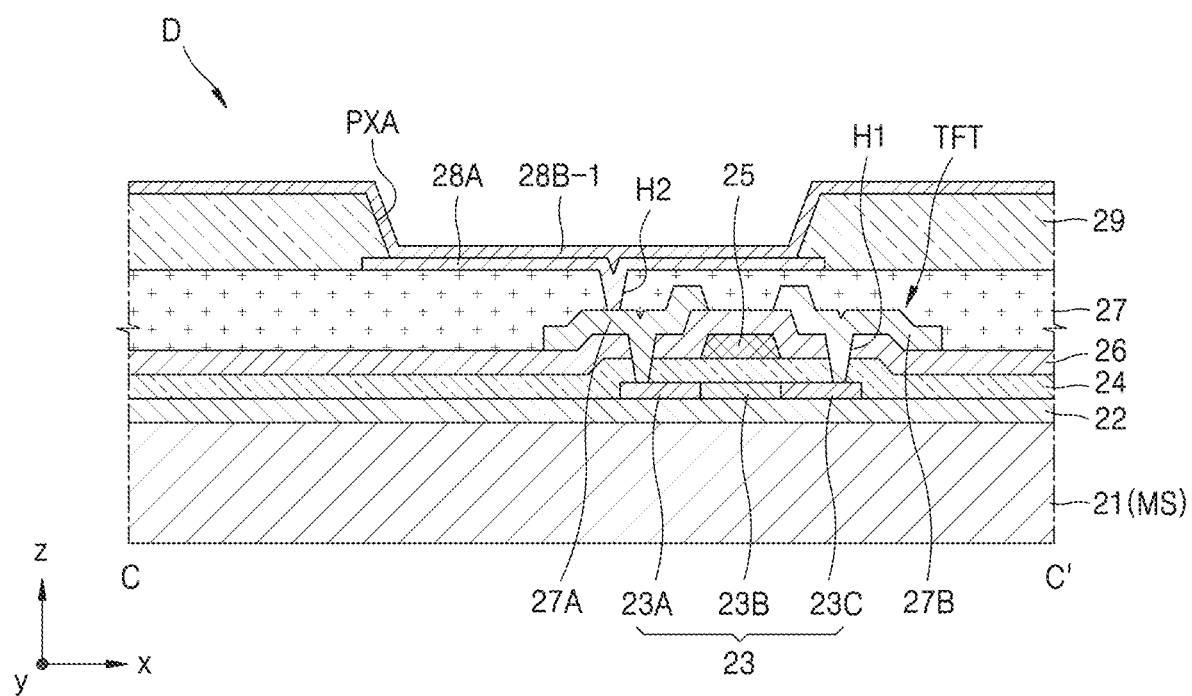
FIG. 7 is a cross-sectional view of the processing substrate taken along line C-C' of FIG. 6.

FIG. 6 is a plan view of the processing substrate MS used in the second processing portion of FIG. 2. FIG. 7 is a cross-sectional view of the processing substrate taken along line C-C' of FIG. 6.

Referring to FIGS. 6 and 7, an embodiment of the processing substrate MS may include various layers on a substrate 21. In one embodiment, for example, the processing substrate MS may include the substrate 21, a thin film transistor TFT, a passivation layer 27, a pixel electrode 28A, and a pixel defining layer 29. In an alternative embodiment, the processing substrate MS may further include at least one selected from a first auxiliary layer 28B-1 and an organic emission layer from among intermediate layers, in addition to the substrate 21, the thin film transistor TFT, the passivation layer 27, the pixel electrode 28A, and the pixel defining layer 29. Hereinafter, for convenience of description, embodiments in which the processing substrate MS includes the substrate 21, the thin film transistor TFT, the passivation layer 27, the pixel electrode 28A, the pixel defining layer 29, and the first auxiliary layer 28B-1 from the intermediate layer will be described in detail.

The substrate 21 may include glass or a polymer resin. The polymer resin may include polyethersulfone, polyacrylate, polyetherimide, polyethylene naphthalate, polyethylene terephthalate, polyphenylene sulfide, polyarylate, polyimide, PC, cellulose acetate propionate, etc. The substrate 21 including the polymer resin may be flexible, rollable, or bendable. The substrate 21 may have a multi-layered structure including a layer including the polymer resin and an inorganic layer (not shown).

The thin film transistor TFT is provided or arranged on the substrate 21, and the passivation layer 27 may cover the thin film transistor TFT.

A buffer layer 22 including an organic compound and/or an inorganic compound is on an upper surface of the substrate 21, and may include $SiO_x$ ($x \geq 1$) or $SiN_x$ ($x \geq 1$).

An active layer 23 is provided or arranged over the buffer layer 22 in a predetermined pattern, and then, the active layer 23 is embedded or covered by a gate insulating layer 24. The active layer 23 includes a source region 23A and a drain region 23C, and further includes a channel region 23B between the source and drain regions 23A and 23B.

The active layer 23 may include at least one selected from various materials. In one embodiment, for example, the active layer 23 may include an inorganic semiconductor material such as amorphous silicon or crystalline silicon. In an alternative embodiment, the active layer 23 may include oxide semiconductor. In another alternative embodiment, the active layer 23 may include an organic semiconductor material. Hereinafter, embodiments in which the active layer 23 includes amorphous silicon will be described in detail for convenience of description.

The active layer 23 may be obtained or formed by arranging an amorphous silicon layer on the buffer layer 22, crystalizing the amorphous silicon layer to a polycrystalline silicon layer, and patterning the polycrystalline silicon layer. In such an embodiment, processing laser may be radiated onto the silicon layer such that the silicon layer is crystallized, by using the apparatus for manufacturing the display device (not shown). In such an embodiment, when the point where the intensity of the processing laser is the peak is rapidly changed, the crystallization of the silicon layer may not be performed uniformly, and thus, spots may occur or the silicon layer may not be partially crystallized, to thereby degrade quality. In an embodiment, high quality processing laser may be generated by controlling oscillation point of each laser as described above, and thus, the silicon layer may be uniformly crystallized.

The source region 23A and the drain region 23C of the active layer 23 are doped with impurities according to a kind of the thin film transistor TFT, e.g., a driving thin film transistor (not shown) or a switching thin film transistor (not shown).

A gate electrode 25 corresponding to an active layer 23 and an interlayer insulating layer 26 embedding or covering the gate electrode 25 are disposed or arranged on an upper surface of the gate insulating layer 24.

In an embodiment, a contact hole H1 is defined or formed in the interlayer insulating layer 26 and the gate insulating layer 24, and after that, a source electrode 27A and a drain electrode 27B are provided or arranged on the interlayer insulating layer 26 to contact the source region 23A and the drain region 23C.

The passivation layer 27 is provided or arranged over the thin film transistor TFT provided as described above, and a pixel electrode 28A of the organic light-emitting device (e.g., an organic light emitting diode ("OLED")) 28 is provided or arranged on the passivation layer 27. The pixel electrode 28A contacts the drain electrode 27B of the thin film transistor TFT via a via hole H2 formed in the passivation layer 27. The passivation layer 27 may have a single-layered structure or two or more layered structure including an inorganic material and/or an organic material, and may be a planarization layer having a flat upper surface without regard to curves of underlayers or may be a curved layer having curves according to the curves of underlayers. In an embodiment, the passivation layer 27 may include a transparent insulator to achieve a resonant effect.

After arranging the pixel electrode 28A over the passivation layer 27, the pixel-defining layer 29 including an organic material and/or an inorganic material may be provided to cover the pixel electrode 28A and the passivation layer 27, and the pixel electrode 28A is exposed through an opening area PXA of the pixel-defining layer 29. In an embodiment, a plurality of opening areas PXA may be formed to be spaced apart from one another in the front surface of the substrate 21. In one embodiment, one opening area PXA may define one pixel after finishing the manufacturing of the display device.

The first auxiliary layer 28B-1 may be on the pixel electrode 28A. In an embodiment, the first auxiliary layer 28B-1 may include at least one selected from a hole injection layer and a hole transport layer. In an embodiment, the first auxiliary layer 28B-1 may be on an entire surface of the substrate 21, or may be only on the opening areas PXA of the pixel defining layer 29 to be spaced apart from one another on adjacent opening areas PXA.

The processing substrate MS as described above may include at least one processing area DOA. The processing area DOA may correspond to a display area DA of a display device 20 that will be described later. In an embodiment, the pixel areas PXA on which the droplets discharged from the respective head portions are arranged and mounted may be in the processing area DOA. In such an embodiment, one pixel area PXA may correspond to one pixel area PXA of the pixel defining layer 29. In such an embodiment, one pixel area PXA may correspond to one pixel after the manufacturing of the display device.

In an embodiment, a plurality of pixel areas PXA may be provided. In such an embodiment, the plurality of pixel areas PXA may be in the processing area DOA to be spaced apart from one another. In an embodiment, the plurality of pixel areas PXA may have the same planar shapes as one another. In an alternative embodiment, although not shown in the drawings, from among the plurality of pixel areas PXA, planar shapes of some pixel areas PXA may be different from those of some other pixel areas PXA. Although not shown in the drawings, in another alternative embodiment, planar shapes of some pixel areas PXA, planar shapes of some other pixel areas PXA, and planar shapes of some other pixel areas PXA from among the plurality of pixel areas PXA may be different from one another. The plurality of pixel areas PXA may form or define a plurality of pixels that will be described later, after finishing the manufacturing of the display device. Hereinafter, embodiments in which the plurality of pixel areas PXA are the same as one another will be described in detail for convenience of description.

In an embodiment, only a single processing area DOA may be defined in the entire surface of the processing substrate MS, although not shown in the drawings. In an alternative embodiment, a plurality of processing areas DOA may be defined in the processing substrate MS to be spaced from one another. In such an embodiment, the processing substrate MS may be isolated via cutting lines CL among adjacent processing areas DOA to generate single display devices. Hereinafter, embodiments in which a plurality of processing areas DOA are defined on the processing substrate MS will be described in detail for convenience of description.

In an embodiment, as shown in FIG. 6, align marks AR may be provided on the processing substrate MS. The align mark AR may be a reference for identifying or calculating a position of each processing area DOA or a position of each pixel area PXA.

In an embodiment where a plurality of processing areas DOA is provided, at least one head portion is in one processing area DOA to supply the droplets. In such an embodiment, where one head portion is provided, a width or a length of the head portion may be equal to or greater than one side of the processing area DOA. In an alternative embodiment, where a plurality of head portions is provided to correspond to one processing area DOA, a sum of the widths of the plurality of head portions or a sum of the lengths of the plurality of head portions may be equal to or greater than one side of the processing area DOA. Hereinafter, embodiments in which one head portion is provided to correspond to one processing area will be described in detail for convenience of description.

Figure 8:
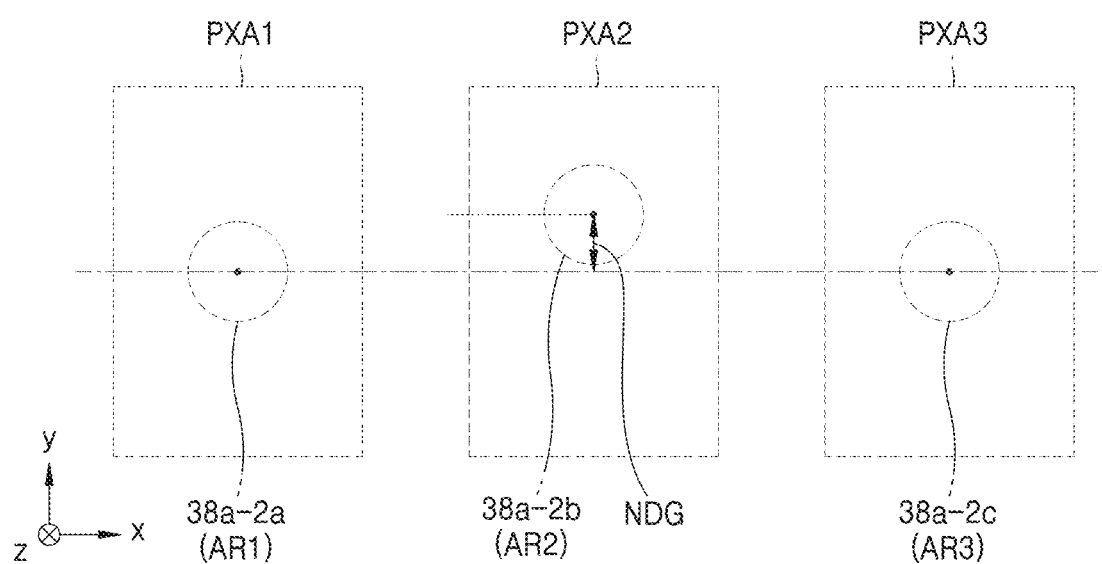
FIG. 8 is a plan view showing a location of a part of a nozzle in the head portion of FIG. 2.
Figure 9:
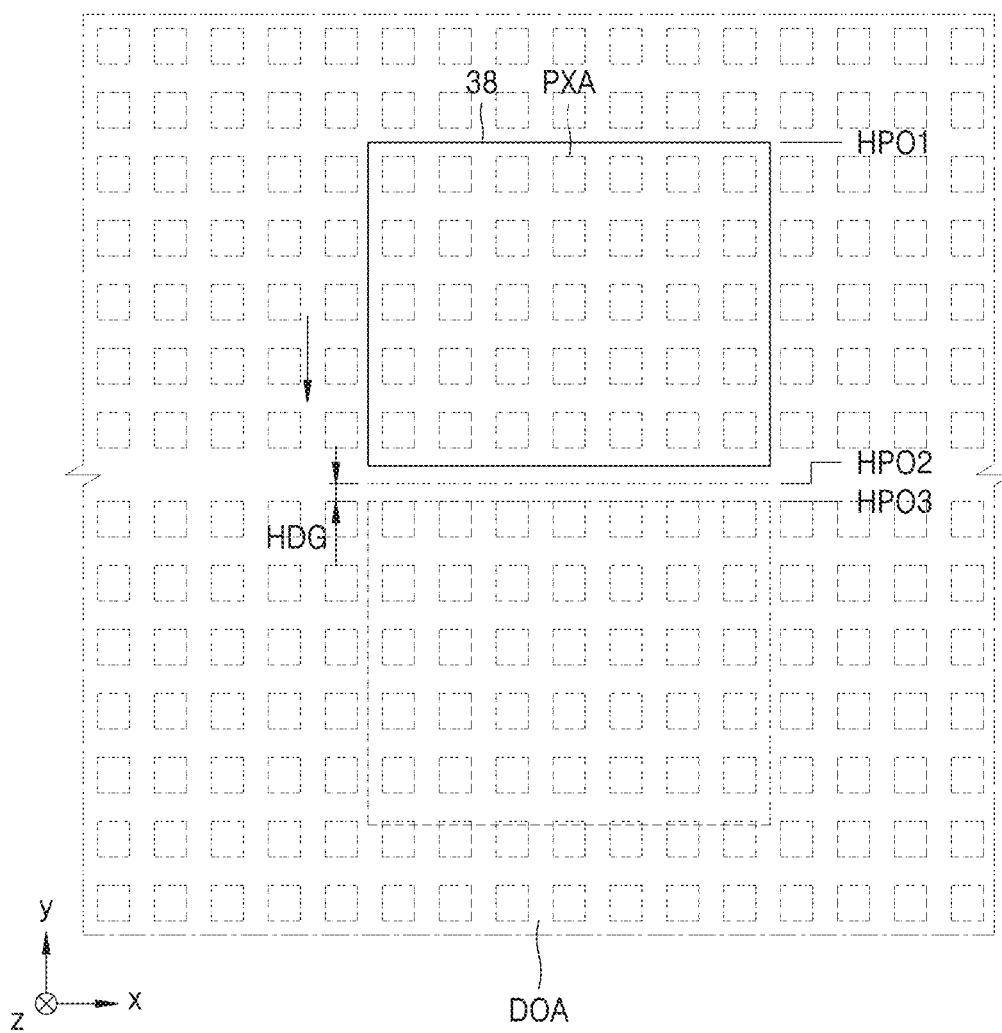
FIG. 9 is a plan view showing a location of the head portion in FIG. 2.

FIG. 8 is a plan view showing a location of a part of a nozzle in the head portion of FIG. 2. FIG. 9 is a plan view showing a location of the head portion in FIG. 2.

Referring to FIGS. 8 and 9, each head portion may be provided at a preset location to supply droplets on the processing substrate. Here, after each head portion is moved to the preset location, the head portion may be controlled independently of each other.

In an embodiment, referring back to FIGS. 2 and 5, after the processing substrate MS is mounted on the substrate rotating member 34, the processing substrate MS may be moved to a certain distance by the substrate moving member 35. In such an embodiment, the controller 80 may control the substrate rotating member 34 and the substrate moving member 35 in a way such that the processing substrate MS may be provided at the preset location. In such an embodiment, the controller 80 may change a posture of the processing substrate MS via the substrate rotating member 34, such that the posture of the processing substrate MS corresponds to a preset posture via the align marks AR on the processing substrate MS.

After finishing the above processes, the controller 80 may apply a signal to each head controller. In an embodiment, the controller 80 may be connected to each head portion in series to transfer the signal to each head portion. In such an embodiment, the signal sent from the controller 80 to each head portion may include an identification number of each head portion, an identification number of a nozzle in each head portion, an amount of droplet discharged from the nozzle of each head portion, the number of times of discharging the droplet from the nozzle of each head portion, a time point of starting the droplet discharge from the nozzle of each head portion, etc.

In an embodiment, as described above, the signal sent from the controller 80 may be sequentially transferred to the head controllers, and each of the head controllers may control the head portion by using data in which the identification number of the head portion corresponds to the head portion controlled by each head controller, in the signal sent from the controller 80. In an embodiment, each head controller may control the amount of the droplet discharged from the corresponding nozzle, the number of times of discharging the droplet, and the time point of discharging the droplet, based on the identification number of each nozzle in the corresponding head portion.

In such an embodiment, each head portion may be provided at an initial set position that is set in advance. In such an embodiment, the initial set position may denote a location where the process initially starts on the processing substrate MS. In one embodiment, for example, as shown in FIG. 6, the head portion may be provided on an upper portion of the processing area DOA at the uppermost side or at a left side of the processing area DOA at the leftmost side.

In such an embodiment, the controller 80 may identify whether the initial set position is identical to an actual start position HPO1 where the process may start. In one embodiment, for example, the actual start position HPO1 may be determined based on data about the processing area DOA on the processing substrate MS and each pixel area PXA in the processing area DOA. In one embodiment, for example, the droplet sensor 36b may sense the processing area DOA on the processing substrate MS and the pixel area PXA in the processing area DOA and then may transfer the sensed result to the controller 80. In such an embodiment, the controller 80 may calculate and store the position of each processing area DOA and each pixel area PXA based on the align marks AR on the processing substrate MS. In an alternative embodiment, the position of the processing area DOA and the position of each pixel area PXA may be measured after providing various layers on the substrate and providing the pixel defining layer on the various layers. In another alternative embodiment, the position of the processing area DOA and the position of the pixel area PXA may be stored in the controller 80 as data values measured at the time of manufacturing another processing substrate MS. Hereinafter, for convenience of description, embodiments in which the controller 80 calculates the position of each processing area DOA and the position of each pixel area PXA based on data obtained when the droplet sensor 36b photographs or scans the processing substrate MS will be described in detail.

In an embodiment, as described above, when the initial set position and the actual start position HPO1 are different from each other, the controller 80 may control at least one of the substrate moving member 35 and the substrate rotating member 34 to adjust the posture and the position of the processing substrate MS, such that the actual start position HPO1 and the initial set position may be identical or correspond to each other. In an alternative embodiment, the controller 80 may change the position of each head portion in a way such that the actual start position HPO1 may be identical or correspond to the initial set position. Hereinafter, for convenience of description, embodiments in which the position and the posture of the processing substrate MS are changed to allow the actual start position HPO1 to be identical to the initial set position will be described in detail.

In an embodiment, as described above, when each head portion is provided at the actual start position HPO1, the controller 80 may control each head controller in a way such that each head portion discharges the droplet. In such an embodiment, the droplet discharged from the nozzle of each head portion may fall on each pixel area PXA. In such an embodiment, one or more nozzles may be provided on the upper surface of each pixel area PXA. Hereinafter, for convenience of description, embodiments in which the number of nozzles provided on the upper surface of each pixel area PXA is one will be described in detail. In such an embodiment, one nozzle may correspond to one pixel area PXA. In such an embodiment, the arrangements of the nozzle in the head portions are similar to or the same as each other, and thus, the arrangement of the first nozzles 38a-2 in the first head portion 38a will hereinafter be described in detail, for convenience of description.

In an embodiment, as described above, when the first head portion 38a is on one processing area DOA, the first head portion 38a may be on an upper surface of a part of the processing area DOA. In such an embodiment, one or more first nozzles 38a-2 in the first head portion 38a may respectively correspond to the pixel areas PXA.

In one embodiment, for example, where a plurality of first nozzles 38a-2 include a first first nozzle 38a-2a, a second first nozzle 38a-2b and a third first nozzle 38a-2c, the first first nozzle 38a-2a, the second first nozzle 38a-2b and the third first nozzle 38a-2c may be adjacent to one another and may be provided in one column. In such an embodiment, the first first nozzle 38a-2a may be on one of the plurality of pixel areas PXA of one processing area DOA, and the second first nozzle 38a-2b may be on one another of the plurality of pixel areas PXA in the processing area DOA. In such an embodiment, the third first nozzle 38a-2c may be on one another of the plurality of pixel areas PXA in one processing area DOA. Herein, for convenience of description, the pixel area PXA corresponding to the first first nozzle 38a-2a is referred to as a first pixel area PXA1, the pixel area PXA corresponding to the second first nozzle 38a-2b is referred to as a second pixel area PXA2, and the pixel area PXA corresponding to the third first nozzle 38a-2c is referred to as a third pixel area PXA3.

The first pixel area PXA1, the second pixel area PXA2, and the third pixel area PXA3 may be adjacent to or not be adjacent to one another. In one embodiment, for example, another pixel area PXA may not be between the first pixel area PXA1 and the second pixel area PXA2. In an alternative embodiment, although not shown in FIG. 8, another pixel area PXA may be between the first pixel area PXA1 and the second pixel area PXA2. Another pixel area may be or may not be between the second pixel area PXA2 and the third pixel area PXA3. Hereinafter, for convenience of description, embodiments in which the first pixel area PXA1, the second pixel area PXA2, and the third pixel area PXA3 are adjacent to one another will be described in detail.

In an embodiment, when the first head portion 38a is on the upper surface of a part of the processing area DOA, the first first nozzle 38a-2a may correspond to the first pixel area PXA1 and the second first nozzle 38a-2b may correspond to the second pixel area PXA2. In such an embodiment, the third first nozzle 38a-2c may correspond to the third pixel area PXA3. In an embodiment, the first first nozzle 38a-2a, the second first nozzle 38a-2b, and the third first nozzle 38a-2c have to be provided in a same column or a same row, but not being limited thereto. Alternatively, at least one of the first first nozzle 38a-2a, the second first nozzle 38a-2b, and the third first nozzle 38a-2c may not be in the same column or the same row as that of the other of the first first nozzle 38a-2a, the second first nozzle 38a-2b, and the third first nozzle 38a-2c due to the shape of the first head portion 38a, a tolerance during the assembling process of the first head portion 38a, etc. In an embodiment, from among the first nozzles 38a-2, when the second first nozzle 38a-2b is provided in the row or the column in which the first first nozzle 38a-2a and the third first nozzle 38a-2c are provided, as shown in FIG. 8, a center of the planar shape of the second first nozzle 38a-2b may not be on an imaginary line connecting a center of the planar shape of the first first nozzle 38a-2a to a center of the planar shape of the third first nozzle 38a-2c. In one embodiment, for example, the center of the planar shape of the second first nozzle 38a-2b may be spaced by a first gap NDG from an imaginary straight line connecting the center of the planar shape of the first first nozzle 38a-2a to the center of the planar shape of the third first nozzle 38a-2c. In such an embodiment, when the first first nozzle 38a-2a, the second first nozzle 38a-2b, and the third first nozzle 38a-2c start to discharge the droplets simultaneously, a location where the first first nozzle 38a-2a discharges the droplet on the first pixel area PXA1 and a location where the third first nozzle 38a-2c discharges the droplet on the third pixel area PXA3 may be identical to each other. In such an embodiment, when the second first nozzle 38a-2b starts to discharge the droplet simultaneously with the first first nozzle 38a-2a and the third first nozzle 38a-2c, the point of the second pixel area PXA2 on which the droplet falls may be different from those of the other nozzles. In such an embodiment, when the first first nozzle 38a-2a, the second first nozzle 38a-2b, and the third first nozzle 38a-2c discharge the droplets at the same time with the same temporal intervals, the first first nozzle 38a-2a may fall the droplet on a first location AR1 of the first pixel area PXA1, the second first nozzle 38a-2b may fall the droplet on a second location AR2 of the second pixel area PXA2, and the third first nozzle 38a-2c may fall the droplet on a third location AR3 of the third pixel area PXA3. In such an embodiment, the first location AR1 and the third location AR3 are on the same line in one direction, but the second location AR2 may not be on the same line as the first location AR1 and the third location AR3. In an embodiment, the first pixel area PXA1, the second pixel area PXA2, and the third pixel area PXA3 may have the centers on the same row or the same column. In such an embodiment, at a boundary of each pixel area, some of the plurality of first nozzles 38a-2 may not accurately supply the droplets to the pixel areas PXA. In one embodiment, for example, when the droplets are controlled to be discharged at the same time point in FIG. 8, the droplet discharged from the second first nozzle 38a-2b may not enter the pixel area PXA accurately at a boundary of the second pixel area PXA2 (e.g., a boundary of the second pixel area PXA2 at the upper side or at the lower side in FIG. 8), and then, the second pixel area PXA2 may not be completely filled with the droplet.

The controller 80 may control the amount of the droplet discharged from each of the first nozzles 38a-2 based on the sensed result of the droplet sensor 36b, to prevent the above issue from occurring. In an embodiment, the controller 80 may calculate a volume of the droplet sensed by the droplet sensor 36b and a total amount of a material to be provided in each pixel area PXA, and then, may control the amount of the droplet discharged from each of the first nozzles 38a-2. In such an embodiment, the controller 80 may adjust an interval of waveform signals applied to each of the first nozzles 38a-2 to adjust the droplet discharged from each of the first nozzles 38a-2.

In an embodiment, when the location of each of the first nozzles 38a-2 is displaced due to the tolerance, etc. as described above, the controller 80 may adjust the starting point of discharging the droplet from each of the first nozzles 38a-2 to be different from the others. In one embodiment, for example, referring to FIG. 8, the controller 80 may control the first first nozzle 38a-2a and the third first nozzle 38a-2c to start the discharge of droplets at the same time, and may control the second first nozzle 38a-2b to start the discharge of the droplet later than the first first nozzle 38a-2a and the third first nozzle 38a-2c. In an alternative embodiment, when the second first nozzle 38a-2b is at the accurate location, the controller 80 may set the point of starting the droplet discharge from the first first nozzle 38a-2a and the third first nozzle 38a-2c to be earlier than that from the second first nozzle 38a-2b.

In an embodiment, when the first first nozzle 38a-2a, the second first nozzle 38a-2b, and the third first nozzle 38a-2c are in a same column, the actual pixel areas PXA may not be in one column. In one embodiment, for example, although not shown in the drawings, a center of one of the first pixel area PXA1, the second pixel area PXA2, and the third pixel area PXA3 may not be on an imaginary straight line connecting centers of the other pixel areas from among the first pixel area PXA1, the second pixel area PXA2, and the third pixel area PXA3. In such an embodiment, the controller 80 may adjust the time points of discharging the droplets respectively from the first first nozzle 38a-2a, the second first nozzle 38a-2b, and the third first nozzle 38a-2c, and thus, the droplets may be accurately supplied to the respective pixel areas PXA even when the pixel areas PXA are not provided in a column.

Therefore, the droplet discharged from each of the first nozzles 38*a*-2 may accurately fall on each pixel area PXA, and thus, the droplet may be accurately supplied into the pixel area PXA.

When the droplet is discharged as described above, the controller 80 may supply the droplet into at least some of the plurality of pixel areas PXA in each processing area DOA by controlling each head portion. In an embodiment, the controller 80 may supply the droplet to the pixel area PXA arranged in one column or one row from among the plurality of pixel areas PXA, by controlling each head portion. In an alternative embodiment, the controller 80 may supply the droplets to some of the pixel areas PXA arranged in at least one column and at least one row from among the plurality of pixel areas PXA, by controlling each head portion.

In an embodiment, as described above, when the first head portion 38*a* supplies the droplets to some parts of one processing area DOA, the controller 80 may linearly move the processing substrate MS via the substrate moving member 35. In such an embodiment, the controller 80 may linearly move the processing substrate MS in one direction via the substrate moving member 35. In an alternative embodiment, the controller 80 may reciprocate the processing substrate MS in one direction via the substrate moving member 35.

After finishing the above processes, the controller 80 may move the first head portion 38*a* to another part of the processing area DOA. In an embodiment, the first encoder 32*a* and the second encoder 33*a* may transfer the current position of the first gantry 33, and the position of each mover to the controller 80. The controller 80 may calculate a current position of each head portion by comparing the position of the first gantry 33 and the position of each mover with reference positions set in advance.

The controller 80 may send each head portion to a set position HPO2 set in advance based on the current position HPO1 of each head portion. The set position HPO2 may indicate a position of the pixel area PXA on which the first head portion 38*a* moves and starts another droplet discharging operation, after finishing one droplet discharging operation, from among the plurality of pixel areas PXA. In one embodiment, for example, as shown in FIG. 9, the current position HPO1 may indicate a location where the first head portion 38*a* starts one discharging operation. In such an embodiment, the current position HPO1 may correspond to the actual start position HPO1 described above. In an alternative embodiment, the current position HPO1 may be a location where the first head portion 38*a* is provided to perform the droplet discharging operation after finishing the processes. Hereinafter, for convenience of description, embodiments in which the current position HPO1 indicates a location where the first head portion 38*a* is provided on a part of the processing area DOA to perform an operation will be described in detail.

After finishing the operation described above, the first head portion 38*a* may move to another operating location. In an embodiment, the controller 80 may determine that the intervals among the pixel areas PXA are consistent, and may control the first head portion 38*a* to move from the current position HPO1 to the set position HPO2. In an embodiment, where an interval between adjacent pixel areas PXA is different from the intervals among the other pixel areas PXA from among the plurality of pixel areas PXA, the first nozzles 38*a*-2 may not accurately correspond to the pixel areas PXA when the first head portion 38*a* is provided at the set position HPO2 set in the controller 80.

The controller 80 may calculate a difference between the set position HPO2 and a control position HPO3 on which the first head portion 38*a* to be actually provided. In an embodiment, the set position HPO2 indicates a location of the pixel area PXA on which the head portion to be provided when the pixel areas PXA are arranged at constant intervals, and the control position HPO3 may indicate a location of the pixel area PXA in the actual processing area DOA where the head portion to be provided based on the actual interval between the pixel areas PXA.

The controller 80 may move the first head portion 38*a* from the current position HPO1 to the control position HPO3. In an embodiment, the controller 80 may move the first head portion 38*a* from the current position HPO1 to the set position HPO2, and then, may less or more move the first head portion 38*a* as much as a difference HDG between the set position HPO2 and the control position HPO3. In one embodiment, for example, when the difference HDG between the set position HPO2 and the control position HPO3 has a negative value, the controller 80 may allow the first head portion 38*a* to be less moved than the set position HPO2 in one direction (e.g., y-axis direction of FIG. 9) as much as the difference HDG between the set position HPO2 and the control position HPO3. In such an embodiment, when the difference HDG between the set position HPO2 and the control position HPO3 has a positive value, the controller 80 may allow the first head portion 38*a* to be further moved from the set position HPO2 in one direction as much as the difference HDG between the set position HPO2 and the control position HPO3. In Here, the distance between the control position HPO3 and the set position HPO2 may be referred to as an error distance, and the distance between the current position HPO1 and the set position HPO2 may be referred to as a set distance. Here, the error distance may have a positive or negative value. The controller 80 may move each head portion from the current position HPO1 as much as a sum of the set distance and the error distance.

In an embodiment, as described above, the controller 80 may calculate the current position HPO1 via values of the first encoder 32*a* and the second encoder 33*a*. In such an embodiment, the controller 80 may send a signal about the amount that the first head portion 38*a* has to move as a value that is to be sensed by the first encoder 32*a* and the second encoder 33*a*.

In an embodiment, as described above, the controller 80 may set each head portion to be provided at the control position HPO3 via the first gantry 33 and the mover 37.

After finishing the above processes, the controller 80 may apply a signal to each head controller. In an embodiment, each head portion may supply the droplet onto the processing substrate MS based on the signal. In an embodiment, where the pixel areas PXA are not arranged in a column or the nozzles are not arranged in a column, the time points of discharging the droplet from the nozzles may be adjusted as described above. In such an embodiment, the processing substrate MS may be linearly moved via the substrate moving member 35.

Therefore, the second processing portion 30 may provide the droplet to an accurate position. The display device manufactured through the above processes may have pixels in accurate patterns and may implement high resolution.

Figure 10:
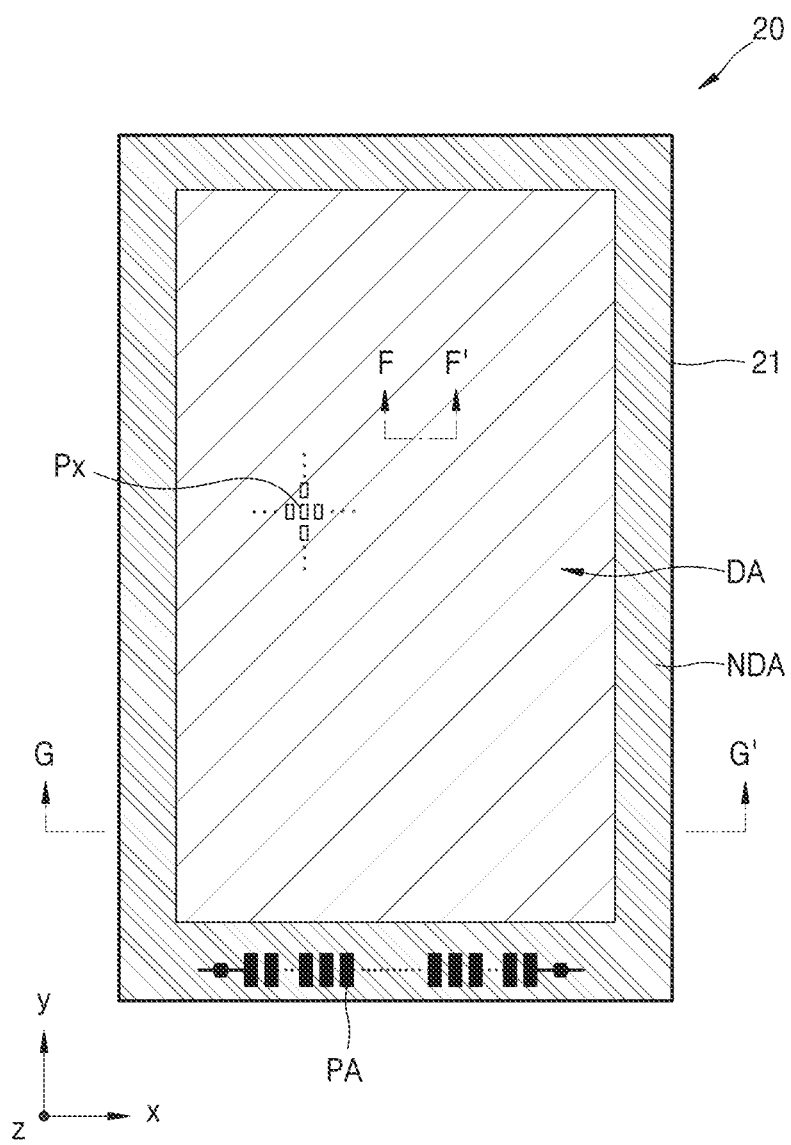
FIG. 10 is a plan view of a display device according to an embodiment.
Figure 11:
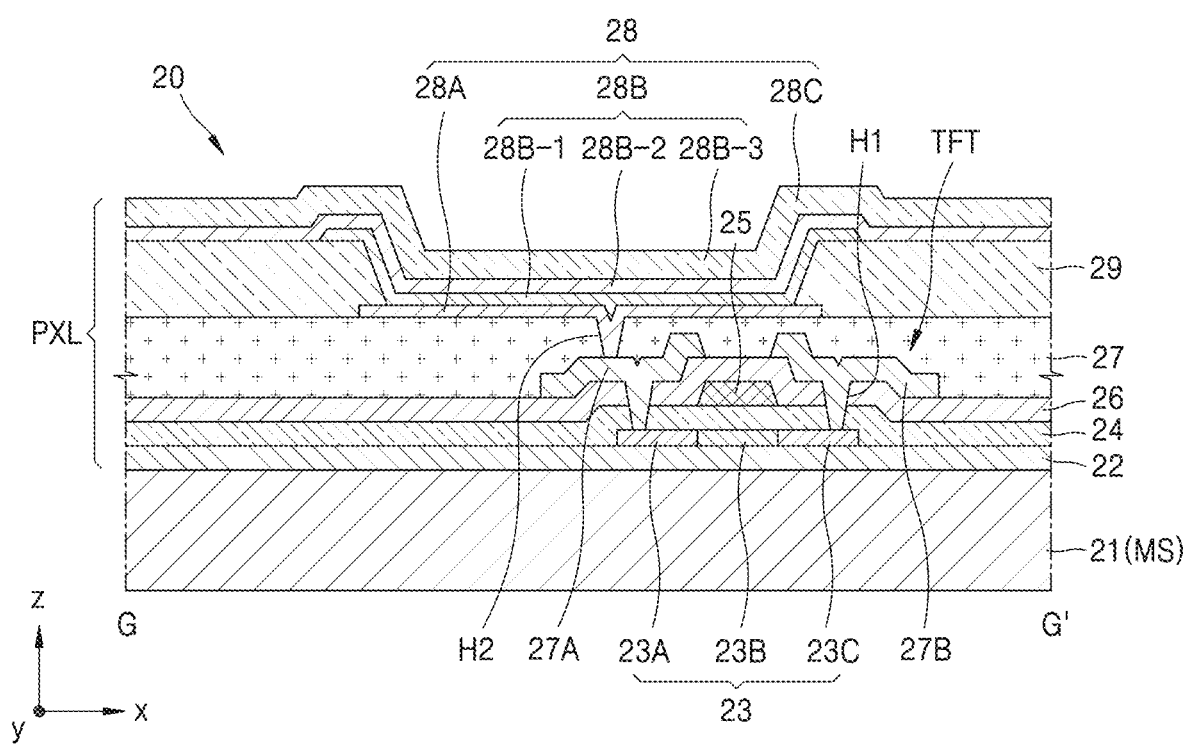
FIG. 11 is a cross-sectional view of the display device taken along line F-F' of FIG. 10.

FIG. 10 is a plan view of a display device 20 according to an embodiment. FIG. 11 is a cross-sectional view of the display device taken along line F-F' of FIG. 10.

Referring to FIGS. 10 and 11, an embodiment of the display device 20 may include a display area DA and a peripheral area NDA on an outer portion of the display area DA. In such an embodiment, the display area DA and the peripheral area NDA may be defined on a substrate 21. Pixels Px may be arranged in the display area DA and power lines (not shown) may be arranged in the peripheral area NDA. In such an embodiment, a pad portion PA may be arranged in the peripheral area NDA.

The display device 20 may include a display layer PXL and a sealing member (not shown). In an embodiment, the sealing member may include a sealing portion on the substrate 21 and an encapsulation substrate (not shown) connected to the sealing portion and facing the substrate 21. In an alternative embodiment, the sealing member may include a thin film encapsulation layer (not shown) that covers or shields at least a part of the display layer PXL.

The substrate 21 may include glass or a polymer resin. The polymer resin may include polyethersulfone, polyacrylate, polyetherimide, polyethylene naphthalate, polyethylene terephthalate, polyphenylene sulfide, polyarylate, polyimide, PC, cellulose acetate propionate, etc. The substrate 21 including the polymer resin may be flexible, rollable, or bendable. The substrate 21 may have a multi-layered structure including a layer including the polymer resin and an inorganic layer (not shown).

The display layer PXL may include a thin film transistor TFT and an organic light-emitting device (e.g., an OLED) 28 on the substrate 21.

The thin film transistor TFT is disposed or arranged on the substrate 21, a passivation layer 27 covers the thin film transistor TFT, and the organic light-emitting device 28 may be disposed or arranged on the passivation layer 27.

A buffer layer 22 including an organic compound and/or an inorganic compound is on an upper surface of the substrate 21, and may include $SiO_x$ ($x \geq 1$) or $SiN_x$ ($x \geq 1$).

An active layer 23 is disposed or arranged over the buffer layer 22 in a predetermined pattern, and the active layer 23 is embedded or covered by a gate insulating layer 24. The active layer 23 includes a source region 23A and a drain region 23C, and further includes a channel region 23B between the source and drain regions 23A and 23B.

The active layer 23 may include at least one selected from various materials. In one embodiment, for example, the active layer 23 may include an inorganic semiconductor material such as amorphous silicon or crystalline silicon. In an alternative embodiment, the active layer 23 may include oxide semiconductor. In another alternative embodiment, the active layer 23 may include an organic semiconductor material. Hereinafter, embodiments in which the active layer 23 includes amorphous silicon will be described in detail for convenience of description.

The active layer 23 may be provided or obtained by arranging an amorphous silicon layer on the buffer layer 22, crystallizing the amorphous silicon layer to a polycrystalline silicon layer, and patterning the polycrystalline silicon layer.

The source region 23A and the drain region 23C of the active layer 23 are doped with impurities according to a kind of the thin film transistor TFT, e.g., a driving thin film transistor (not shown) or a switching thin film transistor (not shown).

A gate electrode 25 corresponding to an active layer 23 and an interlayer insulating layer 26 covering or embedding the gate electrode 25 are arranged on an upper surface of the gate insulating layer 24.

In an embodiment, a contact hole H1 is defined or formed in the interlayer insulating layer 26 and the gate insulating layer 24, and after that, a source electrode 27A and a drain electrode 27B are disposed or arranged on the interlayer insulating layer 26 to contact the source region 23A and the drain region 23C.

The passivation layer 27 is disposed or arranged over the thin film transistor TFT described above, and a pixel electrode 28A of the organic light-emitting device (e.g., an OLED) 28 is disposed or arranged on the passivation layer 27. The pixel electrode 28A contacts the drain electrode 27B of the TFT via a via hole H2 formed in the passivation layer 27. The passivation layer 27 may have a single-layered structure or two or more layered structure including an inorganic material and/or an organic material, and may be a planarization layer having a flat upper surface without regard to curves of underlayers or may be a curved layer having curves according to the curves of underlayers. In an embodiment, the passivation layer 27 may include a transparent insulator to achieve a resonant effect.

In an embodiment, the pixel-defining layer 29 including an organic material and/or an inorganic material is disposed to cover the pixel electrode 28A arranged over the passivation layer 27, and the pixel electrode 28A is exposed through an opening area PXA of the pixel-defining layer 29.

In an embodiment, the intermediate layer 28B and the opposite electrode 28C are on the pixel electrode 28A. In an alternative embodiment, the opposite electrode 28C may be disposed or arranged on an entire surface of the display substrate D. In such an embodiment, the opposite electrode 28C may be disposed or arranged on the intermediate layer 28B and the pixel defining layer 29. Hereinafter, for convenience of description, embodiments in which the opposite electrode 28C is arranged on the intermediate layer 28B and the pixel defining layer 29 will be described in detail.

The pixel electrode 28A functions as an anode electrode and the opposite electrode 28C functions as a cathode electrode, or vice versa.

The pixel electrode 28A and the opposite electrode 28C are insulated from each other by the intermediate layer 28B, and voltages of different polarities are applied to the intermediate layer 28B to make an organic emission layer 28B-2 emit light.

The intermediate layer 28B may include the organic emission layer 28B-2. In an embodiment, the intermediate layer 28B may include the organic emission layer 28B-2, and may further include a first auxiliary layer 28B-1 including at least one selected from a hole injection layer and a hole transport layer, and a second auxiliary layer 28B-3 including at least one selected from an electron transport layer and an electron injection layer, but not being limited thereto. In an alternative embodiment, the intermediate layer 28B may include the organic emission layer and may further include other various functional layers (not shown).

In an embodiment, the intermediate layer 28B may be provided in plural, and the plurality of intermediate layers 28B may form or define the display area DA. The plurality of intermediate layers 28B may be spaced apart from one another in the display area DA.

In an embodiment, one unit pixel includes a plurality of pixels Px, and the plurality of pixels Px may emit light of various colors. In one embodiment, for example, the plurality of pixels Px may include pixels Px that respectively emit red light, green light, and blue light, or pixels Px that respectively emit red light, green light, blue light, and white light. Each of the pixels Px may include the pixel electrode 28A, the intermediate layer 28B, and the opposite electrode 28C described above.

The apparatus 1 for manufacturing the display device shown in FIG. 1 may be used to manufacture the organic emission layer 28B-2 in the intermediate layer 28B, at least one selected from the hole injection layer and the hole transport layer, that is, the first auxiliary layer 28B-1, and at least one selected from the electron injection layer and the electron transport layer, that is, the second auxiliary layer 28B-3, in the same manner as that of the second processing portion 30.

Figure 12:
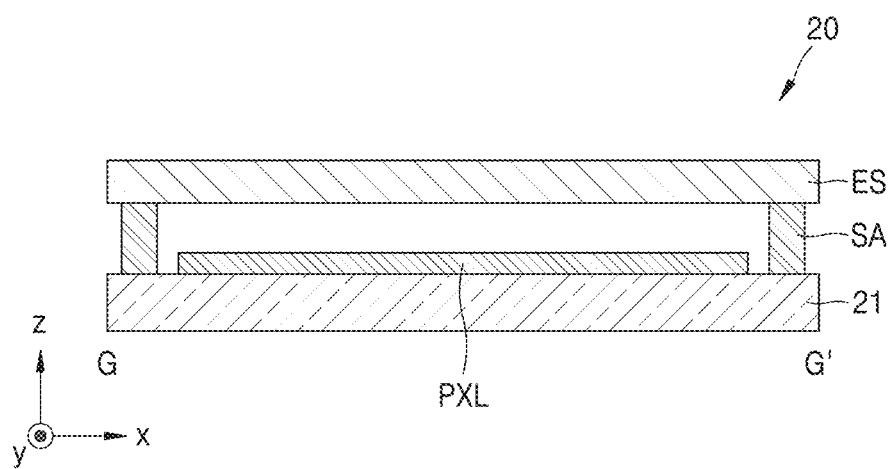
FIG. 12 is a cross-sectional view of the display device taken along line G-G' of FIG. 10 according to an alternative embodiment.

FIG. 12 is a cross-sectional view of the display device taken along line G-G' of FIG. 10 according to an alternative embodiment.

Referring to FIG. 12, an embodiment of the display device 20 may include the substrate 21, the display layer PXL, a sealing unit SA, and an encapsulation substrate ES. In such an embodiment, the sealing unit SA may surround an outer portion of the display layer PXL, and may connect the substrate 21 to the encapsulation substrate ES. In such an embodiment, the encapsulation substrate ES may face the substrate 21, and may shield the display layer PXL with the sealing unit SA. In such an embodiment, the encapsulation substrate ES may include a material that is the same as or similar to that of the substrate 21.

Figure 13:
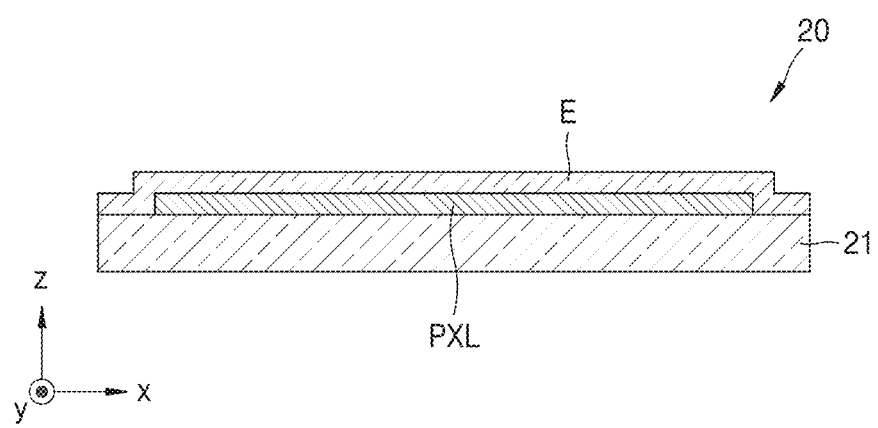
FIG. 13 is a cross-sectional view of the display device taken along line G-G' of FIG. 10 according to another alternative embodiment.

FIG. 13 is a cross-sectional view of the display device taken along line G-G' of FIG. 10 according to another alternative embodiment.

Referring to FIG. 13, an embodiment of the display device 20 may include the substrate 21, the display layer PXL, and a thin film encapsulation layer E. The thin film encapsulation layer E may include a plurality of inorganic layers, or inorganic layers and organic layers.

The organic layer of the thin film encapsulation layer E may include a polymer-based material. The polymer-based material may include at least one selected from polyethylene terephthalate, polyethylene naphthalate, PC, polyimide, polyethylene sulfonate, polyoxymethylene, polyarylate, hexamethyl disiloxane, an acryl-based resin (e.g., polymethyl methacrylate, polyacrylic acid, etc.), and a combination thereof.

The inorganic layer of the thin film encapsulation layer E may include at least one inorganic insulating material selected from aluminum oxide, titanium oxide, tantalum oxide, hafnium oxide, zinc oxide, silicon oxide, silicon nitride, and silicon oxynitride.

The top layer of the thin film encapsulation layer E that is exposed to the outside may include or be formed of an inorganic layer to prevent intrusion of moisture into the organic light-emitting device.

In an embodiment, the thin film encapsulation layer E may include at least one sandwich structure in which at least one organic layer is inserted between at least two inorganic layers. In an alternative embodiment, the thin film encapsulation layer E may include at least one sandwich structure in which at least one inorganic layer is inserted between at least two organic layers. In another alternative embodiment, the thin film encapsulation layer E may include a sandwich structure in which at least one organic layer is inserted between at least two inorganic layers and a sandwich structure in which at least one inorganic layer is inserted between at least two organic layers.

The thin film encapsulation layer E may include a first inorganic encapsulation layer, a first organic encapsulation layer, and a second inorganic encapsulation layer sequentially from the top portion of the organic light-emitting device (e.g., an OLED) 28.

In an alternative embodiment, the thin film encapsulation layer E may include a first inorganic encapsulation layer, a first organic encapsulation layer, a second inorganic encapsulation layer, a second organic encapsulation layer, and a third inorganic encapsulation layer sequentially from the top portion of the organic light-emitting device (e.g., an OLED) 28.

In another alternative, the thin film encapsulation layer E may include a first inorganic encapsulation layer, a first organic encapsulation layer, a second inorganic encapsulation layer, a second organic encapsulation layer, a third inorganic encapsulation layer, a third organic encapsulation layer, and a fourth inorganic encapsulation layer sequentially from the top portion of the organic light-emitting device (e.g., an OLED) 28.

A halogenized metal layer including LiF may be additionally included between the organic light-emitting device (e.g., an OLED) 28 and the first inorganic encapsulation layer. The halogenized metal layer may prevent the organic light-emitting device (e.g., an OLED) 28 from being damaged when the first inorganic encapsulation layer is formed in a sputtering method.

An area of the first organic encapsulation layer may be smaller than that of the second inorganic encapsulation layer, and the area of the second organic encapsulation layer may be smaller than that of the third inorganic encapsulation layer.

In an embodiment where a plurality of inorganic layers is provided as described above, the inorganic layers may be in direct contact with one another on edges of the display device such that the organic layer may not be exposed to outside.

Figure 14:
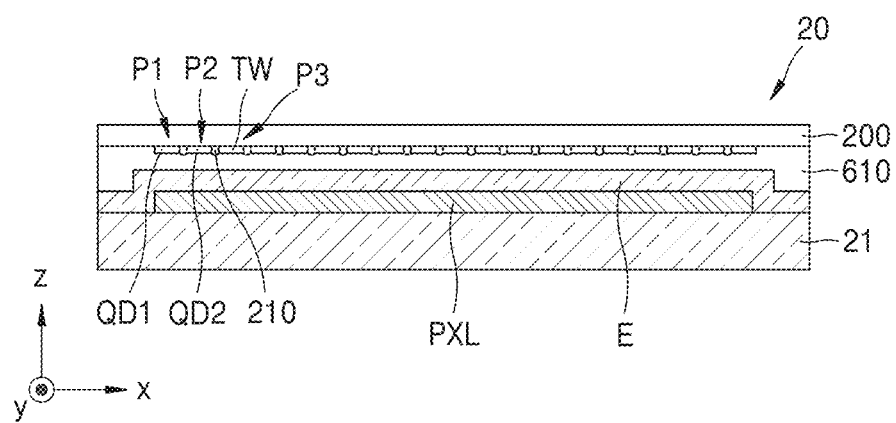
FIG. 14 is a cross-sectional view of the display device taken along line G-G' of FIG. 10 according to another alternative embodiment.

FIG. 14 is a cross-sectional view of the display device taken along line G-G' of FIG. 10 according to another alternative embodiment.

Referring to FIG. 14, an embodiment of the display device 20 may include the substrate 21, the display layer PXL, and a sealing member. In such an embodiment, the sealing member may be substantially the same as that described above with reference to FIG. 12 or FIG. 13. Hereinafter, embodiments in which the sealing member includes the thin film encapsulation layer E will be described for convenience of description.

An embodiment of the display device 20 may include a plurality of pixels P1, P2, and P3 on the display area DA. In such an embodiment, the display device 20 may include an upper substrate 200 including color conversion layers QD1 and QD2 and a light-shielding pattern 210 on the thin film encapsulation layer E.

The color conversion layers QD1 and QD2 may improve the color of light emitted from the organic light-emitting diode OLED or convert the color into a different color. The color conversion layers QD1 and QD2 may be provided as quantum conversion layers including quantum dots. Quantum dots are semiconductor particles each having a diameter in a range of about 2 nanometers (nm) to about 10 nm and having unique electrical and optical properties. When the quantum dots are exposed to light, the quantum dots may emit light of a certain frequency according to sizes of particles, a kind of material, etc. For example, the quantum dots may emit red, green, and blue light when receiving light according to the size of the particle and/or the kind of the material.

A core of a quantum dot may include at least one selected from a Group II-VI compound, a Group III-V compound, a Group IV-VI compound, a Group IV element, a Group IV compound, and a combination thereof.

The Group II-VI compound may include at least one selected from: CdSe, CdTe, ZnS, ZnSe, ZnTe, ZnO, HgS, HgSe, HgTe, MgSe, MgS, and a binary compound selected from a group formed by mixtures thereof; AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a ternary compound selected from a group formed by mixtures thereof; and HgZnTeS, CdZnSeS, CdZnSeTe, CdZnSTe, CdHgSeS, CdHgSeTe, CdHgSTe, HgZnSeS, HgZnSeTe, HgZnSTe, and a quaternary compound selected from a group formed by mixtures thereof.

The Group III-V compound may include at least one selected from: GaN, GaP, GaAs, GaSb, AlN, AlP, AlAs, AlSb, InN, InP, InAs, InSb and a binary compound selected from a group formed by mixtures thereof; GaNP, GaNAs, GaNSb, GaPAs, GaPSb, AlNP, AlNAs, AlNSb, AlPAs, ALPSb, InGaP, InNAs, InNP, InNAs, InNSb, InPAs, InPSb, GaAlNP, and a ternary compound selected from a group formed by mixtures thereof; and GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a quaternary compound selected from a group formed by mixtures thereof.

The Group IV-VI compound may include at least one selected from f: SnS, SnSe, SnTe, PbS, PbSe, PbTe, and a binary compound selected from a group formed by mixtures thereof; SnSeS, SnSeTe, SnSTe, PbSeS, PbSeTe, PbSTe, SnPbS, SnPbSe, SnPbTe, and a ternary compound selected from a group formed by mixtures thereof; and SnPbSSe, SnPbSeTe, SnPbSTe, and a quaternary compound selected from a group formed by mixtures thereof. The Group IV element may be selected from Si, Ge, and mixtures thereof. The Group IV compound may include a binary compound selected from SiC, SiGe, and mixtures thereof.

Here, the binary compound, the ternary compound, or the quaternary compound may be present in the particles in a uniform concentration, or may be present in the same particle with partially different concentration distributions. Also, the quantum dot may have a core/shell structure, in which one quantum dot surrounds another quantum dot. An interface between the core and the shell may have a concentration gradient in which a concentration of an element in the shell decreases towards a center of the core.

In an embodiment, the quantum dot may have the core-shell structure including a core having a nano-crystal and a shell surrounding the core. The shell of the quantum dot may act as a protective layer for preventing chemical modification of the core and maintaining semiconductor characteristics and/or a charging layer for applying an electrophoretic characteristic to the quantum dot. The shell may have a single-layered structure or a multi-layered structure. An interface between the core and the shell may have a concentration gradient in which a concentration of an element in the shell decreases towards a center of the core. The shell of the quantum dot may include oxide of a metal or non-metal material, a semiconductor compound, or a combination thereof.

In one embodiment, for example, the oxide of the metal or non-metal material may include, but is not limited to, a binary compound such as $SiO_2$, $Al_2L_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, etc., or a ternary compound such as $MgAl_2O_4$, $CoFe_2O_4$, $NiFe_2O_4$, $CoMn_2O_4$, etc.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but is not limited thereto.

The quantum dot may have a full width of half maximum ("FWHM") of the light emitting wavelength spectrum of about 45 nm or less, for example, about 40 nm or less, in particular, about 30 nm or less, and may improve color purity or color reproduction within the above range. Also, the light emitted from the quantum dot is omni-directional, and thus, an optical viewing angle may be increased.

The quantum dot may be in any conventional shape, for example, may be a spherical, pyramidal, multi-arm, or a cubic nanoparticle, or may be a nanotube, nanowire, nanofiber, or nanoplate particle, etc.

The color conversion layers QD1 and QD2 may at least partially correspond to pixel areas defined by opening areas in the pixel defining layer 29. In one embodiment, for example, the first color conversion layer QD1 may correspond to a pixel area of a first pixel P1, and the second color conversion layer QD2 may correspond to a pixel area of a second pixel P2. The color conversion layer may not correspond to the pixel area of a third pixel P3, but a transmission window TW may be provided on the pixel area. The transmission window TW may include an organic material through which the light emitted from the OLED of the third pixel P3 may be discharged without changing a wavelength thereof. However, one or more embodiments are not limited thereto. Alternatively, the color conversion layer may be also provided on the pixel area of the third pixel P3.

Dispersion particles may be distributed in the color conversion layers QD1 and QD2 and the transmission window TW. Accordingly, a uniform color spreadability may be obtained.

The light-shielding pattern 210 may be between the color conversion layers QD1 and QD2 and the transmission window TW. The light-shielding pattern 210 may include a black matrix and may improve color sharpness and contrast. The light-shielding pattern 210 may be provided between the emission areas of the pixels P1, P2, and P3. Because the light-shielding pattern 210 may include a black matrix absorbing visible ray, the light-shielding pattern 210 may prevent color mixture of the light emitted from the emission areas of neighboring pixels and may improve visibility and contrast.

In an embodiment, the OLEDs may all emit blue light. In such an embodiment, the first color conversion layer QD1 may include quantum dots, from which red light may be emitted, and the second color conversion layer QD2 may include quantum dots, from which green light is emitted. Accordingly, red light, green light, and blue light may be emitted from the display device, and expression of various colors may be implemented through combination of the colors.

A filler 610 may be further provided between the substrate 100 and the upper substrate 200. The filler 610 may buffer external pressure, etc. The filler 610 may include an organic material such as methyl silicone, phenyl silicone, polyimide, etc. However, one or more embodiments are not limited thereto, and the filler 610 may include an organic sealant such as a urethane-based resin, or an epoxy-based resin, an acryl-based resin, or an inorganic sealant such as silicone.

Figure 15:
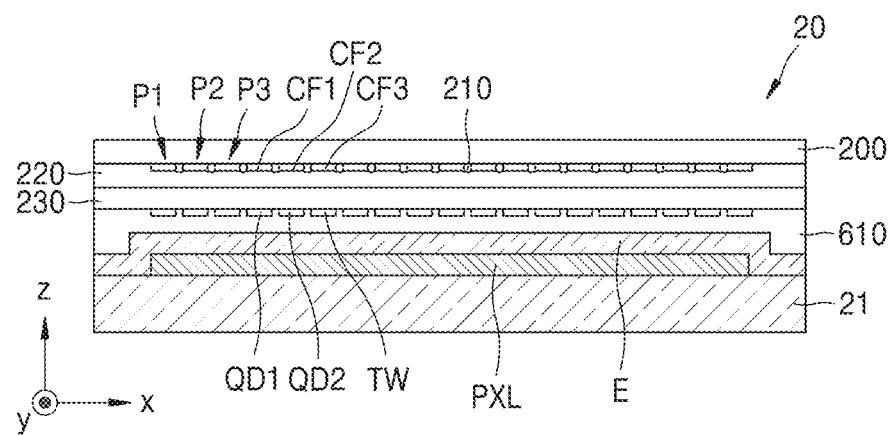
FIG. 15 is a cross-sectional view of the display device taken along line G-G' of FIG. 10 according to another alternative embodiment.

FIG. 15 is a cross-sectional view of the display device taken along line G-G' of FIG. 10 according to another alternative embodiment.

Referring to FIG. 15, an embodiment of the display device 20 may include the substrate 21, the display layer PXL, and a sealing member. In such an embodiment, the sealing member may be substantially the same as that described above with reference to FIG. 12 or FIG. 13. Hereinafter, embodiments in which the sealing member includes the thin film encapsulation layer E will be described for convenience of description.

In an embodiment, first to third color filters CF1, CF2, and CF3 may be on the upper substrate 200. The first to third color filters CF1, CF2, and CF3 may be adopted to implement full-color images, improve color purity, and improve outdoors visibility.

The first to third color filters CF1, CF2, and CF3 may correspond to the emission areas of the pixels P1, P2, and P3 on the upper substrate 200. The light-shielding pattern 210 may be provided between the first to third color filters CF1, CF2, and CF3.

A protective layer 220 may cover the light-shielding pattern 210 and the first to third color filters CF1, CF2, and CF3. The protective layer 220 may include an inorganic material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The protective layer 220 may include an organic material such as polyimide, epoxy, etc.

The first color conversion layer QD1, the second color conversion layer QD2, and the transmission window TW may respectively overlap the first color filter CF1, the second color filter CF2, and the third color filter CF3 with the protective layer 220 therebetween. An additional protective layer 230 may be further provided on the upper substrate 200, to cover the first color conversion layer QD1, the second color conversion layer QD2, and the transmission window TW. The additional protective layer 230 may include an organic material or an inorganic material.

The first color conversion layer QD1 and the second color conversion layer QD2 may include quantum dots emitting different colors from each other. In one embodiment, for example, the first color conversion layer QD1 may emit red light and the second color conversion layer QD2 may emit green light. In such an embodiment, the transmission window TW may transmit the blue light emitted from the OLED of the third pixel P3.

In such an embodiment, the first color filter CF1 may include a red color filter, the second color filter CF2 may include a green color filter, and the third color filter CF3 may include a blue color filter. In such an embodiment, the color filters may be provided or formed by using the apparatus for manufacturing the display device described above.

According to embodiments of the apparatus and method of manufacturing the display device using the apparatus, the display device capable of emitting light with fine patterns may be manufactured.

According to embodiments of the apparatus and method of manufacturing the display device using the apparatus, mechanical errors that occurs during manufacturing of the display device may be reduced. The apparatus and method of manufacturing the display device as described above may be applied in various fields. For example, the apparatus and method of manufacturing the display device may be used to form a liquid crystal in a liquid crystal display apparatus. Alternatively, the apparatus and method of manufacturing the display device may be used to form quantum dots in the embodiments of FIGS. 14 and 15.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method of manufacturing a display device, the method comprising:
    calculating a difference between a set position, on which a head portion is set to be positioned in advance, and a control position on which the head portion is to be actually positioned;
    sensing a current location of the head portion, on which the head portion is currently positioned, the current position of the head portion being different from the control position and the set position; and
    moving the head portion from the current location as much as a sum of the set position and a difference between the set position and the control position.

2. The method of claim 1, wherein the control position of the head portion corresponds to a plurality of pixel areas which are defined on a processing substrate to be spaced apart from one another.

3. The method of claim 1, further comprising:
    arranging a processing substrate on a substrate mounting portion.

4. The method of claim 3, further comprising:
    linearly moving the processing substrate to the substrate mounting portion.

5. The method of claim 3, further comprising:
    supplying a droplet from the head portion to the processing substrate.

6. The method of claim 1, further comprising:
    discharging a droplet from at least one of a plurality of nozzles in the head portion at a different time point from a time point when another of the nozzles in the head portion discharges a droplet.

7. The method of claim 6, further comprising:
    sensing impact locations of droplets discharged from the nozzles of the head portion.

8. The method of claim 1, wherein
    the head portion is provided in plural, and
    a plurality of head portions is controlled independently of one another.

9. The method of claim 8, wherein
    the head portions respectively include a plurality of head controllers, and
    one of the head controllers is connected to the controller in series,
    another of the head controllers is connected to an adjacent head controller in series, and
    the signal sent from the controller is sequentially transferred respectively to the head controllers.

* * * * *